(12) United States Patent
Or-Bach et al.

(10) Patent No.: US 7,105,871 B2
(45) Date of Patent: *Sep. 12, 2006

(54) SEMICONDUCTOR DEVICE

(75) Inventors: Zvi Or-Bach, San Jose, CA (US); Laurence Cooke, Los Gatos, CA (US); Adrian Apostol, Neamt (RO); Romeo Iacobut, Neamt (RO)

(73) Assignee: eASIC Corporation, Santa Clara, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 10/730,064

(22) Filed: Dec. 9, 2003

(65) Prior Publication Data

US 2004/0161878 A1  Aug. 19, 2004

Related U.S. Application Data

(63) Continuation-in-part of application No. 10/321,669, filed on Dec. 18, 2002, now Pat. No. 6,953,956.

(51) Int. Cl.
*H01L 27/10* (2006.01)

(52) U.S. Cl. .................. 257/203; 257/620; 257/773

(58) Field of Classification Search ............... 257/202, 257/203, 620, 734, 773, 786
See application file for complete search history.

(56) References Cited

U.S. PATENT DOCUMENTS

| | | | |
|---|---|---|---|
| 3,401,126 A | 9/1968 | Miller et al. | |
| 3,429,040 A | 2/1969 | Miller | |
| 4,545,610 A | 10/1985 | Lakritz et al. | |
| 4,733,288 A | 3/1988 | Sato | |
| 4,937,475 A | 6/1990 | Rhodes et al. | |
| 5,016,080 A | 5/1991 | Giannella | |
| 5,217,916 A | 6/1993 | Anderson et al. | |
| 5,264,729 A * | 11/1993 | Rostoker et al. | 257/774 |
| 5,514,884 A * | 5/1996 | Hively et al. | 257/203 |
| 5,650,348 A | 7/1997 | Pasch | |
| 5,656,851 A | 8/1997 | Hamilton et al. | |
| 5,721,151 A | 2/1998 | Padmanabhan et al. | |
| 5,801,406 A | 9/1998 | Lubow et al. | |
| 5,994,766 A | 11/1999 | Shenoy et al. | |
| 6,075,711 A * | 6/2000 | Brown et al. | 361/761 |
| 6,184,711 B1 | 2/2001 | Graef et al. | |
| 6,194,912 B1 | 2/2001 | Or-Bach | |
| 6,236,229 B1 | 5/2001 | Or-Bach | |
| 6,245,634 B1 | 6/2001 | Or-Bach | |
| 6,316,334 B1 | 11/2001 | Sivilotti et al. | |
| 6,331,733 B1 | 12/2001 | Or-Bach et al. | |
| 6,331,789 B1 | 12/2001 | Or-Bach | |
| 6,331,790 B1 | 12/2001 | Or-Bach et al. | |
| 6,356,958 B1 | 3/2002 | Lin | |
| 6,403,448 B1 | 6/2002 | Reddy | |
| 6,476,493 B1 | 11/2002 | Or-Bach et al. | |
| 6,613,611 B1 * | 9/2003 | How et al. | 438/130 |
| 6,671,865 B1 | 12/2003 | Ali et al. | |
| 6,693,454 B1 * | 2/2004 | Cox | 326/39 |

OTHER PUBLICATIONS

"Multi-Function FET I/O Masterslice Cell," IBM Tech. Disc. Bull., Jun. 1986, vol. 29, No. 1, pp. 88-94.*

* cited by examiner

*Primary Examiner*—T. N. Quach
(74) *Attorney, Agent, or Firm*—Venable LLP; Jeffrey W. Gluck

(57) ABSTRACT

A semiconductor device may include a borderless logic array and area I/Os. The logic array may comprise a repeating core, and at least one of the area I/Os may be a configurable I/O. Furthermore, the configurable I/O may comprise at least one metal layer that is the same for all I/O configurations.

23 Claims, 41 Drawing Sheets

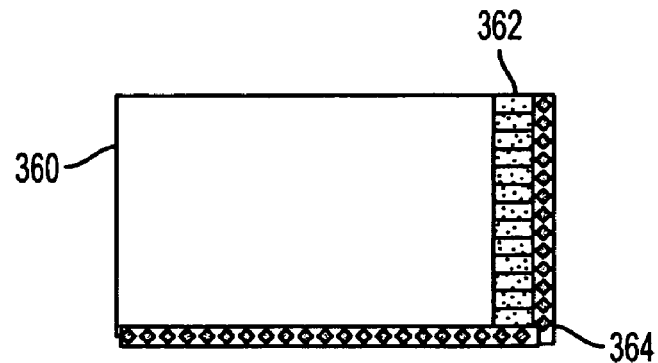
FIG. 36-A
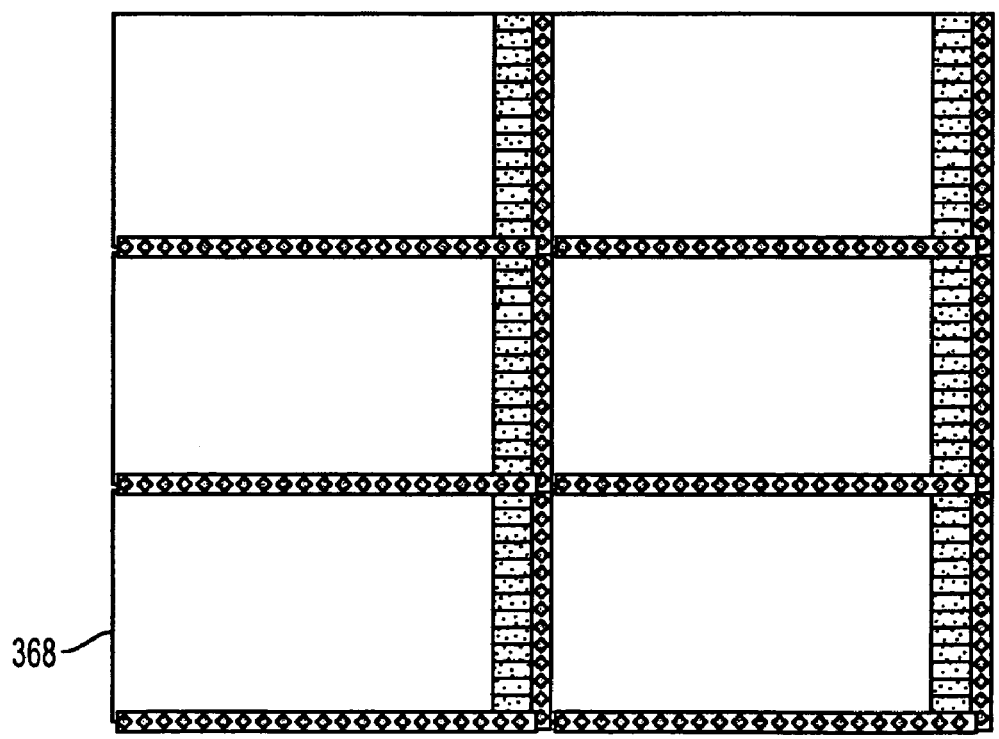
FIG. 36-B

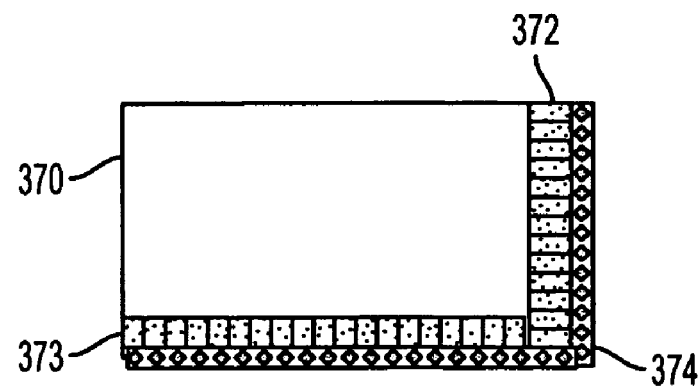
FIG. 37-A
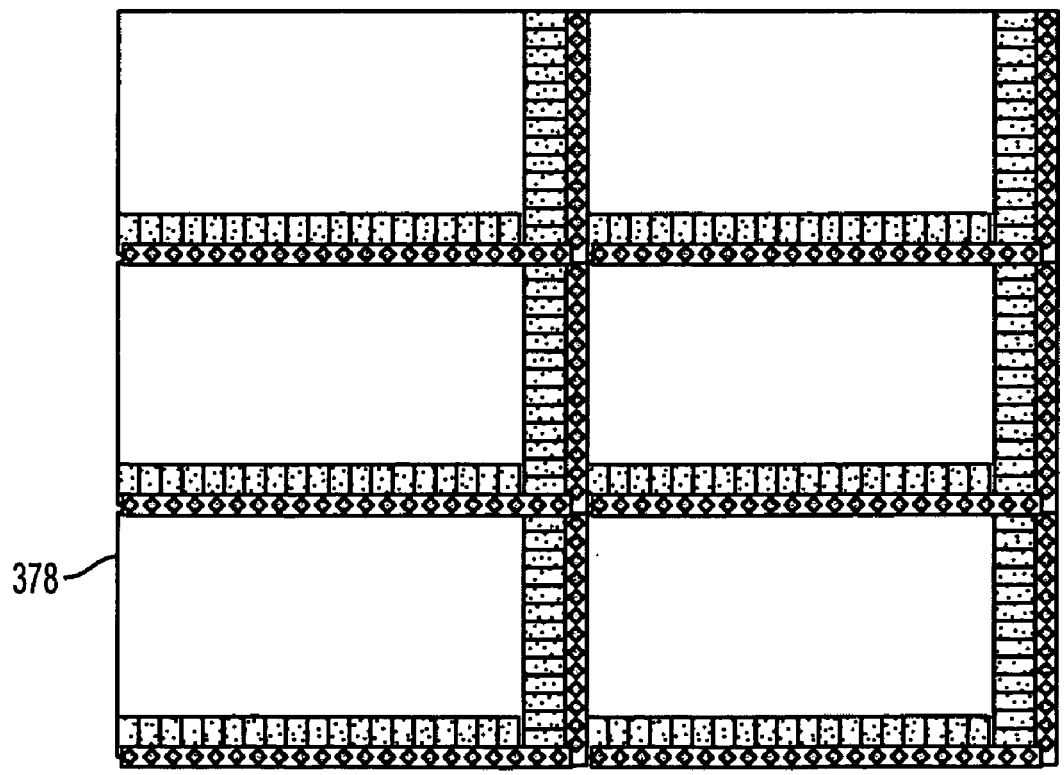
FIG. 37-B

SEMICONDUCTOR DEVICE

CROSS-REFERENCE TO RELATED APPLICATIONS

This application is a continuation in part of commonly-assigned U.S. patent application Ser. No. 10/321,669, filed Dec. 18, 2002 now U.S. Pat. No. 6,953,956 and entitled, "Method for Fabrication of Semiconductor Device,". This application is incorporated herein by reference in its entirety.

BACKGROUND OF THE INVENTION

1. Field of the Invention

The present invention relates to logic arrays and fabrication method for custom integrated circuit 2. Discussion of Background Art Semiconductor manufacturing is known to improve device density in exponential manner over time, but such improvements do come with a price. The cost of mask set required for each new process technology has been increasing exponentially. In addition, the minimum fabrication quantity due to the increases of wafer size has also increased exponentially at the same time.

These changes represent an increasing challenge primarily to custom products, which tend to target smaller volume and less diverse markets therefore making the increased cost of product development and reduction of manufacturing flexibility very hard to accommodate.

Custom Integrated Circuits can be segmented into two groups. The first group includes devices that have all their layers custom made. The second group includes devices that have at least some generic layers used across different custom products. Well known examples of the second kind are Gate Arrays, which use generic layers for all layers up to contact layer, and FPGAs which utilize generic layers for all their layers. This second group of custom integrated circuits is also sometimes called semi-custom devices due to their broader applicability. The generic layers in such devices are mostly a repeating pattern structure in array form.

The use of generic layers across multiple application provides saving for the individual custom product with respect to the cost of masks and economies of scale. In 1996 Chip Express of Santa Clara, Calif., introduced a logic array called CX2000 that utilized a base logic cell equivalent to about 4 logic gates. At a later time Lightspeed Semiconductor of Sunnyvale, Calif., introduced their 3G Modular Array product family. These more advanced logic arrays use generic layers, comprising mostly repeating pattern, also for some of the metal layers such as contact, Metal-1, Via-1 and Metal-2. These types of logic arrays are sometime called Module Arrays and require less custom layers. A very advanced Module Array technology was introduced by eASIC of San Jose, Calif., in September 2000.

That Module Arrays uses generic layers such as Metal-1 and Metal-2 to define the logic array, in conjunction with generic layers such as Metal-3 and Metal-4 to provide a generic connectivity fabric. The generic connectivity fabric comprises of repeating patterns that are also structured in array form. Such arrangement allows to further reduce the number of custom layers required for design customization. eASIC technology, as described in U.S. Pat. No. 6,331,790 is going further toward the goal minimizing the number of custom masks and requires only a single custom via mask.

The logic array technology is based on a generic fabric that is customized for a specific design during the customization stage. As designs tend to be highly variable in the amount of logic and memory each one needs, vendors of logic array create product families with a number of Master Slices covering a range of logic and memory size options. Yet, it is always a challenge to come up with minimum set of Master Slices that will provide a good fit for maximal number of designs.

U.S. Pat. No. 4,733,288 issued to Sato Shinji Sato in March 1988, discloses a method "to provide a gate-array LSI chip which can be cut into a plurality of chips, each of the chips having a desired size and a desired number of gates in accordance with a circuit design." The prior art in the references cited presents few alternative methods to utilize generic structure for a different size of custom devices.

The array structure fits the objective of variable sizing. The difficulty to provide variable-sized devices is due to the need of providing I/O cells and associated pads to connect the device to the package. To overcome this limitation Sato suggests a method where I/O could be constructed from the transistors that are also used for the general logic gates. A similar approach was also suggested by Anderson. U.S. Pat. No. 5,217,916 issued to Anderson et al. on Jun. 8, 1993, discloses a configurable gate array free of predefined boundaries—borderless—using transistor gate cells, of the same type of cells used for logic, to serve the input and output function. Accordingly, the input and output functions may be placed to surround the logic array sized for the specific application. This method presents a severe limitation on the I/O cell to use the same transistors as used for the logic and would not allow the use of higher operating voltage for the I/O.

U.S. Pat. No. 5,721,151 issued to Padmananabhan et al. on Feb. 24, 1998, suggests the use of contiguous number of micro-arrays each surrounded by an I/O array—conventionally structured—but having these micro-arrays interconnected to form 'composite array'. Padmananabhan suggests few ways to use the I/O that end up internal in the 'composite array' such as to drive signals from one micro-array to another or to be bonded using bump and flip-chip technology. The method suggested by Padmananabhan has some severe limitations. For example having each micro-array surrounded by an I/O array results in the micro-array being relatively large to allow for a reasonable ratio of logic transistors to I/O transistors. That results in 151' suggestion to have "unused macro-arrays being cut away and discarded"

The current invention seeks to overcome many of the prior-art limitations. It is known in the art that I/O and pads do not need to be at the edge of the semiconductor device. Semiconductor devices could be using the flip chip or C-4 (controlled collapse chip connection) technology described in U.S. Pat. Nos. 3,401,126 and 3,429,040 by Miller that had been used for over 30 years in IBM's mainframe computer modules. In these approaches the bonding pads are deployed in an area array over the surface of the chip known as area bonding and may use I/O cells known as area I/O placed near the area pads. Flip Chip packaging is known in the art to use an additional final metal layer known as the redistribution layer, to allow proper distribution of the device I/O to the area pads.

SUMMARY OF THE INVENTION

The present invention seeks to provide a new method for semiconductor device fabrication that is highly desirable for custom products. The current invention suggests the use of direct-write e-Beam in conjunction with a continuous logic array. The continuous array utilizes area I/O with area pads to allow variable sizing of designs and placing them on a wafer with various numbers of repetitions. The current invention provides solution to the challenge of high cost of mask-set and low flexibility that exist in the currently-common methods of semiconductor fabrication. An additional advantage of the invention is that it reduces the high cost of manufacturing the many different mask sets required in order to provide acceptable range of master slices. The current invention improves upon the prior art in many respects, including the way the semiconductor device is structured and those related to methods of fabrication of semiconductor devices.

The prior art reflected the motivation to better fit the device size to the custom application and therefore saving on wasted silicon. The current invention reflects the motivation to save on the cost of masks with respect to the investment that would have been otherwise required to put in place proper set of master slices. The current invention also seeks to provide the ability to incorporate memory blocks in the custom device. The current invention provides a method to customize the device with respect the amount of logic and memory required.

The main point of the current invention is the use of area I/O to provide a continuous fabric that provides a continuous terrain of logic and I/O and also provides the ability to mix-in continuous terrain of memory with islands of special functions like PLL and SERDES. The current invention shows that with area I/O and redistribution layer to connect the area I/O to area pads, many of the limitation of the prior art are overcome. A greater level of flexibility is therefore provided. The current invention also suggests to utilize Module Array, whereby additional layers such as Metal-1 and Metal-2 are generic and would be part of such borderless continuous terrain. Furthermore, the current invention also suggests the use of segmented routing whereby some of the connectivity layers are also generic and would be a part of the continuous terrain. In such fabric only few layers need to be customized while most of the layers are generic and consist primarily of a repeating pattern. A favorable embodiment of the current invention is a continuous terrain customizable by single custom via layer. Furthermore, the current invention suggests the use of direct-write e-Beam for those few custom layers. An added advantage of the current invention is the use of direct-write e-Beam on the continuous terrain to provide on the same wafer different product types, with different amount of product units of the various product types. The very large size of current wafer allows hundreds of device units, each of different type, built on a single wafer. Therefore the current invention allows to provide "on-demand" semiconductor device manufacturing, where one customers could get few units of one type of device for prototype work, while another may get few hundreds of devices for low volume production, all from a single wafer fabrication process.

To allow such level of flexibility with borderless terrain, the current invention suggests wafer level customization using equipment like direct-write e-Beam and dicing the wafer using highly flexible dicing using equipment like laser-based dicing. Such equipment allows mix and match of various die sizes on the wafer, as opposed to the saw dicing commonly used in the industry, which requires dicing along complete straight lines from one wafer edge to the other. An added advantage of the current invention's is the use of area pads and homogenous pad terrain so single probe card could be use for various devices.

The present invention also seeks to provide an improved semiconductor device including borderless logic array; area I/Os; and a redistribution layer for redistributing at least some of the area I/Os.

Preferably some of the pads are used to connect the semiconductor device to other devices and overlays at least a portion of the logic array or a portion of the area I/Os.

Preferably the semiconductor device also includes a borderless memory array. Preferably the logic array includes a module array. Preferably the logic array includes interconnections within the logic array, wherein the logic array interconnections include metal layers and via layers, and wherein at least one of the metal layers comprises substantially repeating pattern.

And according to one embodiment of the invention, the logic array interconnection includes at least two of metal layers each with substantially repeating patterns. And according to another embodiment of the invention, the logic array interconnection includes at least three metal layers with substantially repeating patterns for portions used for the interconnections. Preferably the area I/Os are positioned in a non-surrounding fashion with respect to the logic array. Preferably, the logic array includes a repeating module, and wherein the area I/Os are positioned in a non-surrounding fashion with respect to at least one of the repeating module. Preferably at least one of the area I/Os is a configurable I/O and wherein such configurable I/O comprises at least one metal layer that is the same for all I/O configurations.

There is thus provided in accordance with a preferred embodiment of the invention, a method of fabricating a semiconductor device, comprising the steps of: providing a semiconductor substrate; forming a borderless logic array, including a plurality of area I/Os, on the semiconductor substrate; and forming a redistribution layer for redistributing at least some of the area I/Os.

Preferably also including the step of: forming pads to connect the semiconductor device to other devices, and wherein at least one of the pads overlays at least a portion of the logic array or a portion of the area I/Os.

Preferably also including the steps of: placing and routing a specific design on the logic array; and marking marks for an edge of a used portion of the logic array according to the step of placing and routing.

Preferably the step of marking comprises photolithography, and also including a step of dicing the semiconductor substrate according to the marks.

Preferably the step of dicing includes laser dicing.

There is thus provided in accordance with another preferred embodiment of the invention, a method of fabricating an integrated circuit, comprising the step of: Providing a semiconductor substrate, forming a borderless logic array including a memory array, a plurality of area I/Os and also including the step of forming redistribution layer for redistribution at least some of the area I/Os for the purpose of the device packaging.

Preferably also including the steps of: placing and routing a specific design on the logic array and the memory array; and marking marks for an edge of a used portion of the logic array and the memory array according to the step of placing and routing.

Preferably the step of marking, includes photolithography, and also including a step of dicing the semiconductor substrate according to the marks.

Preferably the step of dicing includes laser dicing. Alternatively, Direct-Write eBeam could be used for such marking step.

There is thus provided in accordance with another preferred embodiment of the invention, a method of fabricating an integrated circuit, comprising the step of: providing a semiconductor substrate, forming a borderless logic array including, a plurality of area I/Os and also including the step of forming redistribution layer for redistribution at least some of the area I/Os for the purpose of the device packaging and wherein the logic array includes a module array.

Preferably such logic array comprises a repeating core, and wherein the step of forming a borderless logic array comprises the step of positioning said area I/Os within the core and wherein at least one of the area I/O is configurable I/O and the configurable I/O comprises at least one metal layer that is the same for all I/O configuration.

Alternatively a method of fabricating an integrated circuit wafer comprises one of the above methods of fabricating a semiconductor device and also comprising the steps of: placing and routing a specific design called A' and the steps of: placing and routing a second specific design called B' on said logic array; and wherein the location on the wafer in which design A' is placed is independent of the location on the wafer in which design B' is placed.

In another embodiment of this invention the semiconductor wafer comprises a borderless logic array; wherein the borderless logic array comprises repeating module containing logic cells and I/O cells; and a redistribution layer for redistributing at least some of the I/Os cells connection to pads used in packaging.

Preferably the I/O cells are arrange in spaced parallel lines. Preferably, spaced parallel lines are spaced at least 0.2 mm apart but less than 3 mm.

In another embodiment of this invention the repeating module comprises at least three metal layers. And in another alternative at least one of the metal layers comprises repeating pattern. And yet, in another alternative at least two of the metal layers comprise a repeating pattern.

In another embodiment of the present invention the semiconductor wafer also comprises additional custom layers which are arranged to form specific die size on the wafer.

In another embodiment the additional custom layers are arranged to form at least two different die sizes on the wafer.

In another embodiment of the present invention a semiconductor device comprises repeating I/O cells, wherein the repeating I/O cells could be customized to different function by using only custom via layers.

Additionally the device also comprises repeating logic cells, wherein the device could be customized by using only custom via layers.

There is thus provided in accordance with another preferred embodiment of the invention, a method of fabricating an integrated circuit, comprising the steps of:

providing a semiconductor substrate, forming a borderless logic array including a plurality of area I/Os and also including the step of forming redistribution layer for redistribution at least some of the area I/Os for the purpose of the device packaging, and wherein the logic array is interconnected by metal layers and via layers, and wherein at least one of the metal layers comprises at least one substantially repeating pattern for a portion used for interconnecting.

And according to one embodiment of the invention, at least two of the metal layers include substantially repeating patterns for portions used for interconnecting.

And according to another embodiment of the invention, at least three of the metal layers comprise substantially repeating patterns for portions used for the interconnection.

There is thus provided in accordance with a preferred embodiment of the invention, a method of fabricating a semiconductor device, comprising the steps of:

providing a semiconductor substrate; forming a borderless logic array, including a plurality of area I/Os, on the semiconductor substrate; and forming a redistribution layer for redistributing at least some of the area I/Os. And also includes the step of utilizing a direct write technique to customize the logic array.

Preferably the step of marking utilizes a direct write technique.

There is thus provided in accordance with a preferred embodiment of the invention, a method of fabricating a semiconductor device, comprising the steps of: providing a semiconductor substrate; forming a borderless logic array, including a plurality of area I/Os, on the semiconductor substrate; and forming a redistribution layer for redistributing at least some of the area I/Os, and wherein the step of forming a borderless logic array comprises the step of positioning the area I/Os in a non-surrounding fashion with respect to the logic array.

There is thus provided in accordance with another preferred embodiment of the invention, a method of fabricating a semiconductor device, comprising the steps of:

providing a semiconductor substrate; forming a borderless logic array, including a plurality of area I/Os, on the semiconductor substrate; and forming a redistribution layer for redistributing at least some of the area I/Os, and wherein the logic array includes a repeating core, and wherein the step of forming a borderless logic array includes the step of positioning the area I/Os in a non-surrounding fashion with respect to at least one of the repeating core.

Preferably at least one of the area I/O is configurable I/O.

Preferably also including the step of: performing photolithography, wherein a reticle is projected over the semiconductor substrate, and wherein the used portion comprises elements from two projections.

There is thus provided in accordance with a preferred embodiment of the invention, a method of fabricating an integrated circuit wafer, comprising the steps of:

providing a semiconductor substrate; forming a borderless logic array, including a plurality of area I/Os, on the semiconductor substrate; and forming a redistribution layer for redistributing at least some of the area I/Os.

Preferably also comprising the step of: forming pads to connect the semiconductor device to other devices, wherein at least one of the pads overlays at least a portion of the logic array or a portion of the area I/Os.

Preferably also including the steps of: placing and routing a specific design on the logic array; and marking marks for an edge of a used portion of the logic array according to the step of placing and routing.

Preferably the step of marking comprises photolithography, and also includes a step of dicing the semiconductor substrate according to the marks.

Preferably the step of dicing includes a step of laser dicing.

There is thus provided in accordance with a preferred embodiment of the invention, a method of fabricating an integrated circuit wafer, comprising the steps of: providing a semiconductor substrate; forming a borderless logic array, including a memory array, a plurality of area I/Os, on the semiconductor substrate; and forming a redistribution layer for redistributing at least some of the area I/Os.

Preferably also comprising the steps of: placing and routing a specific design on the logic array and the memory array; and marking marks for an edge of a used portion of the logic array and the memory array according to the step of placing and routing.

Preferably the step of marking comprises photolithography, and also comprising a step of dicing the semiconductor substrate according to the marks.

Preferably the step of dicing includes laser dicing.

Preferably the logic array includes a module array.

Preferably the logic array is interconnected by metal layers and via layers, and wherein at least one of the metal layers includes at least one substantially repeating pattern for a portion used for interconnecting.

Alternatively at least two of the metal layers include substantially repeating patterns for portions used for the interconnecting.

Preferably the step of placing and routing is done for a specific design called A' and also for another specific design called B', and wherein the location on the wafer in which design A' is placed is independent of the location on the wafer in which design B' is placed.

Alternatively the step of placing and routing is done for a specific design called A' and also for another specific design called B', and wherein a number of times that design A' is placed on the wafer is independent of a number of times that design B' is placed on the wafer.

Preferably the step of marking includes the step of utilizing a direct write technique.

Preferably the step of placing and routing is done for a specific design called A' and also for another specific design called B', and wherein a silicon area ratio of logic array to memory array in design A' is substantially larger than a silicon area ratio of logic array to memory array in design B'.

Preferably the step of marking includes the step of utilizing a direct write technique.

Preferably also including the step of probing the wafer, wherein the step of probing utilizes the same wafer probe to test design A' and design B'.

Preferably also comprising the step of probing the wafer, wherein the step of probing utilizes the same wafer probe to test design A' and design B'.

Preferably also comprising the step of probing the wafer, wherein the step of probing utilizes the same wafer probe to test design A' and design B'.

Preferably also comprises the step of utilizing a direct write technique to customize the logic array.

Preferably the design A' and design B' are probed simultaneously.

Preferably design A' and design B' are probed simultaneously.

There is thus provided in accordance with additional preferred embodiment of the invention, a method of fabricating an integrated circuit wafer with improved yield, comprising the steps of: providing a semiconductor substrate; forming a borderless logic array, including a plurality of area I/Os, on the semiconductor substrate; and forming a redistribution layer for redistributing at least some of the area I/Os, and further comprising the steps of: testing and marking modules on the logic array; placing specific designs on the logic array so as to avoid faulty modules; and customize the logic array according to placement of specific designs; testing and marking the specific designs; and dicing the logic array according to placement and marking of specific designs.

Preferably utilizing a direct write technique to customize the logic array.

Preferably having one or more pads dedicated to testing.

Preferably also including the step of using a probe card to independently test one or more modules simultaneously.

Preferably one or more of the pads dedicated to testing are not the area I/Os for the specific designs.

Preferably at least one of the area I/Os comprises a configurable I/O.

Preferably the configurable I/O comprises multiple copies of input, output, and pre-output cells, and wherein the semiconductor device further comprises connections between at least one of the input, output, and pre-output cells and area I/O pads to construct an area I/O.

BRIEF DESCRIPTION OF THE DRAWINGS

The present invention will be understood and appreciated more fully from the following detailed description, taken in conjunction with the drawings in which:

FIG. 36, consisting of FIGS. 36-A and 36-B, is a drawing illustration of a repeating module;

FIG. 37, consisting of FIGS. 37-A and 37-B, is a drawing illustration of a repeating module;

DETAILED DESCRIPTION OF PREFERRED EMBODIMENTS

The present invention is now described with reference to FIGS. 1–39, it being appreciated that the figures illustrate the subjects matter not to scale or to measure.

Figure 1:
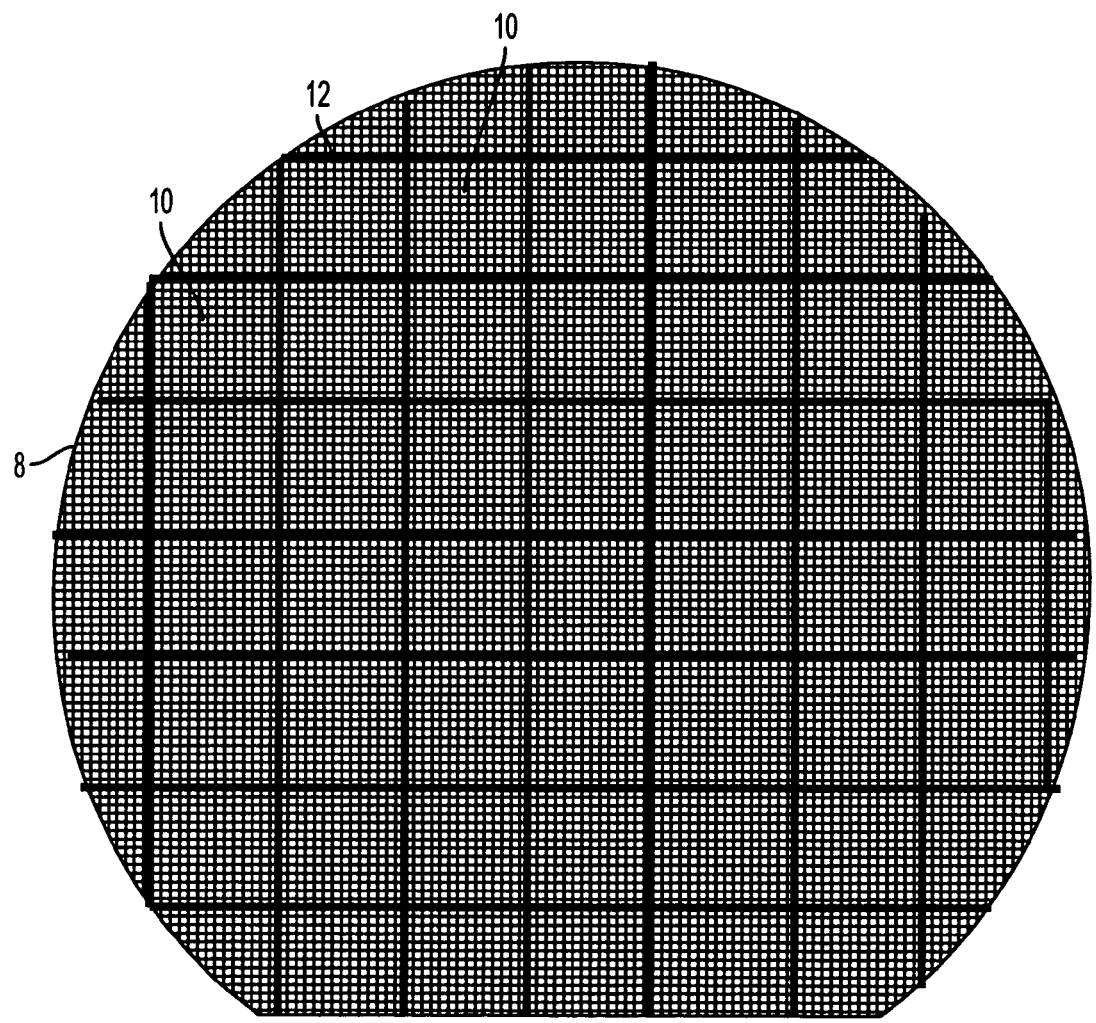
FIG. 1 is a drawing illustration of a wafer marked with reticle projections.

The current method of semiconductor fabrication is on lithography step for each layer. The dominating lithography technique of submicron process is called step and repeat. The layer pattern will be drawn into mask also called reticle. Such reticle may be projected over an area of about 20 mm×20 mm by the lithography tool called Stepper. Then the Stepper steps the wafer so the reticle would be projecting the same pattern on area next to it and so on, and so forth. FIG. 1 illustrates a wafer 8 with marks 12 of reticle projections 10. With an 8-inch wafer, over 50 copies of the reticle will be typically stepped on one such wafer.

The current invention suggests the use of a much less common lithography technique called direct-write using e-Beam. Such could be done, for example, with direct-write e-Beam—Leica ZBA32 offered by Leica Microsystems Lithography GmbH Jena, Germany or F5112 offered by Advantest, Japan. Direct-write e-Beam allows direct writing any pattern at any location over the wafer, without the use of a physical mask. Direct-write e-beam is not used in commercial fabrication of semiconductor devices due the low throughput and the implication of such on a single wafer cost. The current invention suggests the combination of reticle technique for the generic portion of logic array and the use of direct-write e-Beam for the custom layers. A very good fit with this method is the logic array invented by eASIC, as only it provides a logic array that could be customized with single via layer. Via layer can be written much faster than metal layer with direct-write e-Beam and would make such combination method commercially viable.

Such direct-write e-Beam fabrication method are highly attractive for custom designs as previously described. Since single wafer may have room for hundreds of devices, the current invention seeks to allow multiple designs to be placed on one wafer and further, to allow each of these designs to be of different size and, even further, to allow placing different quantities of such designs on a single wafer, to support on one wafer the fabrication needs of both prototype volumes for some design and pre-production volumes for other designs.

While direct-write e-Beam is the most common technique, other direct-write lithography could be used. A laser mask write systems like Sigma 7000 from Micronic could be modified for such usage.

Figures 1, 2:
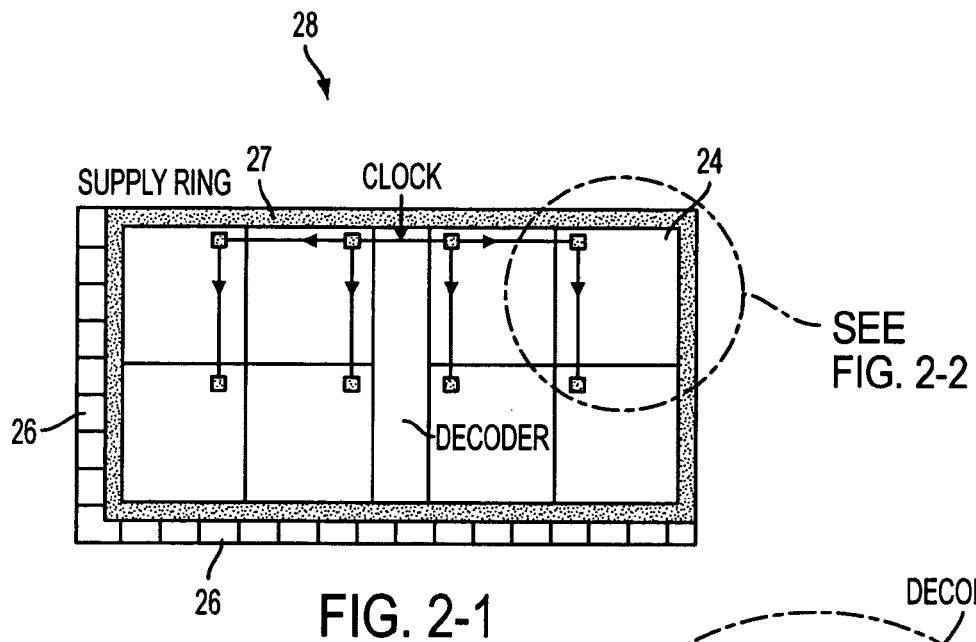
FIG. 2, consisting of FIGS. 2-1, 2-2, and 2-3, is a drawing illustration of a repeating core.
Figure 2:
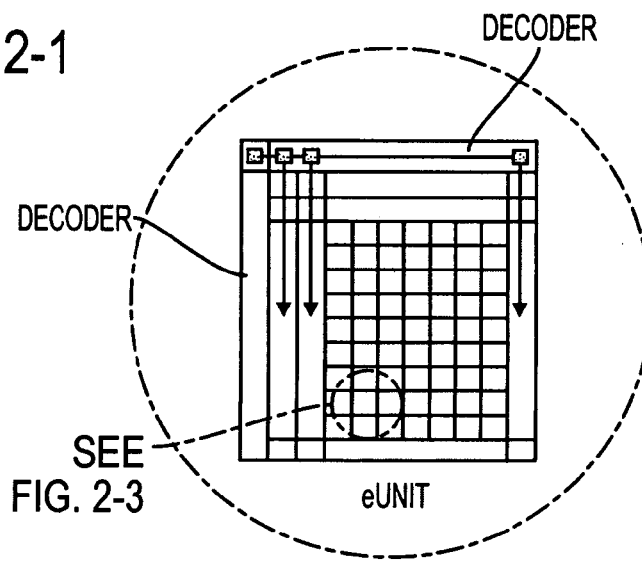

The current invention suggests a new architecture of logic array. This new architecture blends logic array with array of area I/O and array of area pads. Therefore it provides a continuous fabric instead of the master slice approach. Such fabric could comprise of a repeating structure—repeating core—as is illustrated in FIG. 2. The repeating core 28 comprises a set of area I/O 26 and then logic array 24 which is constructed from array of eCells 22. The area I/O may be constructed with thick oxide to allow them to operate at higher voltage appropriate to interface with the element outside the device, while the logic array might be using thin oxide to operate at low voltage to reduce power consumption and allow higher performance and packing density. The area I/O might comprise elements that are common at boundary I/O such as ESD protection and latch-up protection. The area I/O could be configurable I/O that could be customized to the specific function by the custom layers used to customize the logic. The area I/O could include fixed function like input and output functions. The power supply to the core 28 and to the area I/O 26 could be supplied from the same group of area pads. FIG. 2A is an illustration of a vertical slice 21 of typical eCell. FIG. 2A illustrates eight metal layers device. M1 25 is a short name for the first metal layer called Metal 1 and so forth up to the top metal layer M8 29 which is the eights metal layer Metal 8. The eCell structure is such that M1 to M3 are used for the construction of the eCell's internal circuit while M4 to M7 are used to construct the interconnection fabric for the interconnection between various eCells. As described before to customize the fabric of eCells 28 only single via layer need to be custom made—via 6 23, the via layer between M5 and M6.

Figures 2, 3:
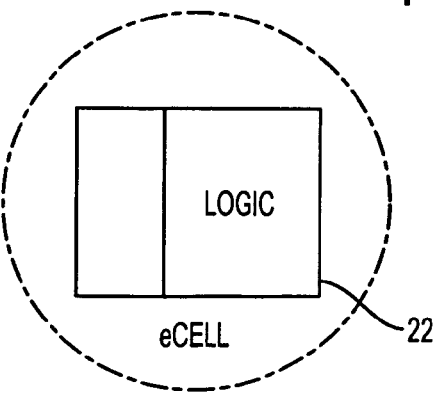
Figure 2A:
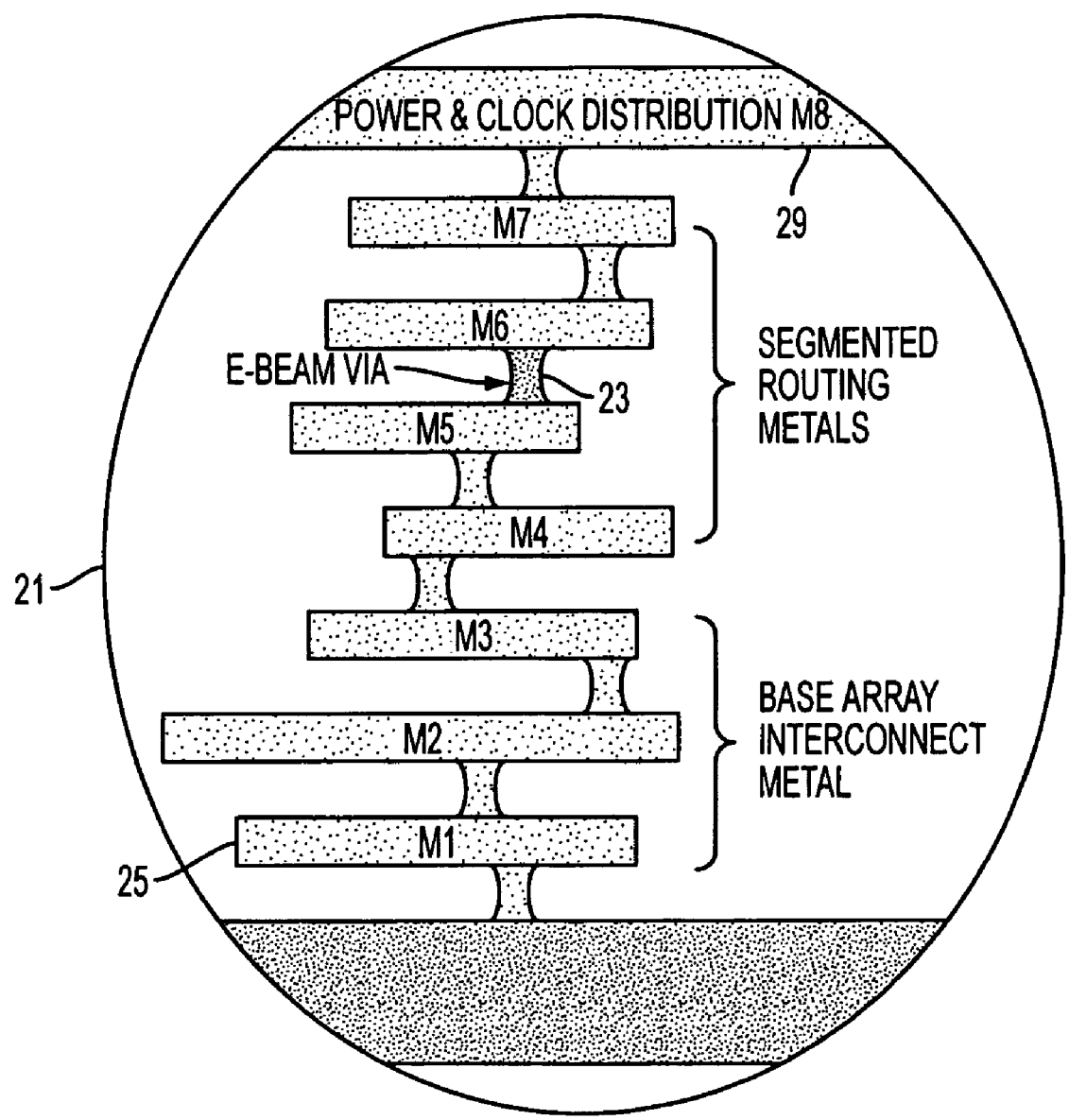
FIG. 2A is a drawing illustration of a vertical cut.
Figure 3A:
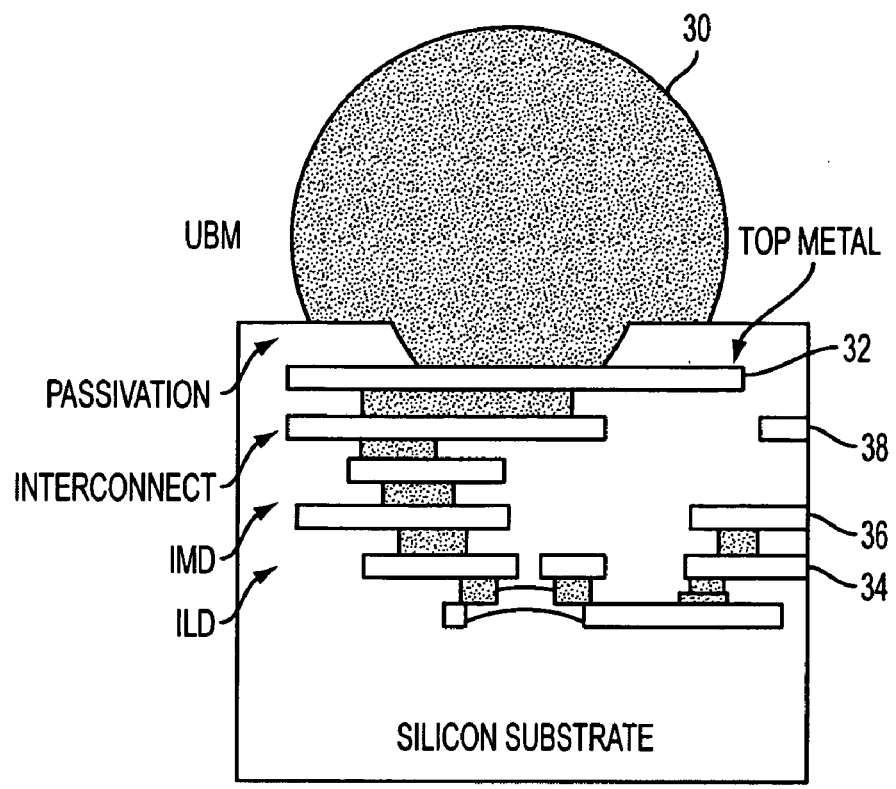
FIG. 3A is a drawing illustration of an area pads.
Figure 3B:
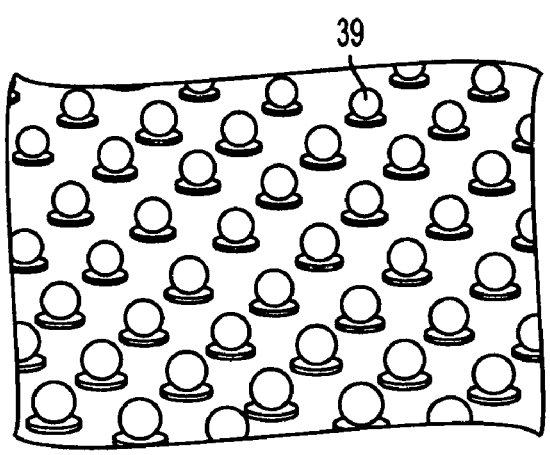
FIG. 3B is a pictorial illustration of a area pads-showing soldering balls.
Figure 4:
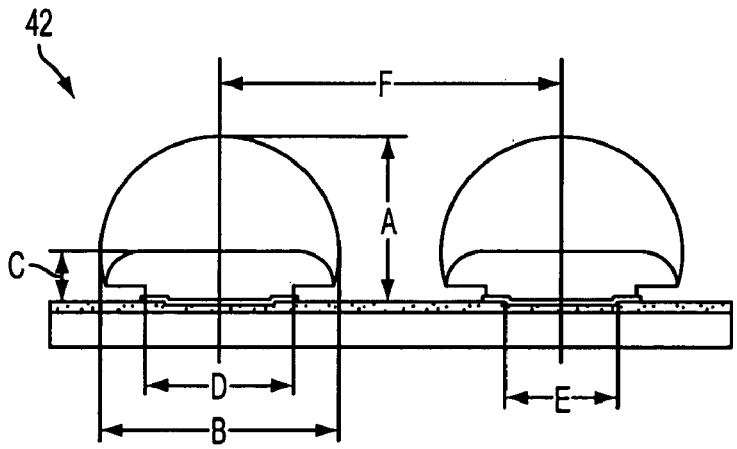
FIG. 4 is a detail drawing illustration of the area pads.

FIG. 3 is a drawing and pictorial illustration of the area pads. FIG. 3A is a vertical cut drawing showing one area pad and the associated bump 30, and the layers underneath it including a thick layer 32 sometimes called redistribution layers and the underlying layers such as Metal-1 34, Metal-2 36 and Metal-4 38. FIG. 3B is a pictorial of section of the top surface of a device according to the current invention, with a regular array of area pads in the forms of bumps 39. FIG. 4 is a detailed drawing illustration of an area pads and sample sizes for such bumps. To maximize the number of pads per area, it is common to place the area pads in a regular array as can be seen in FIG. 3B. Consequently it is useful to have a top metal layer for pads redistribution, to allow area pads placement to be independent from area I/O placement.

Figure 5:
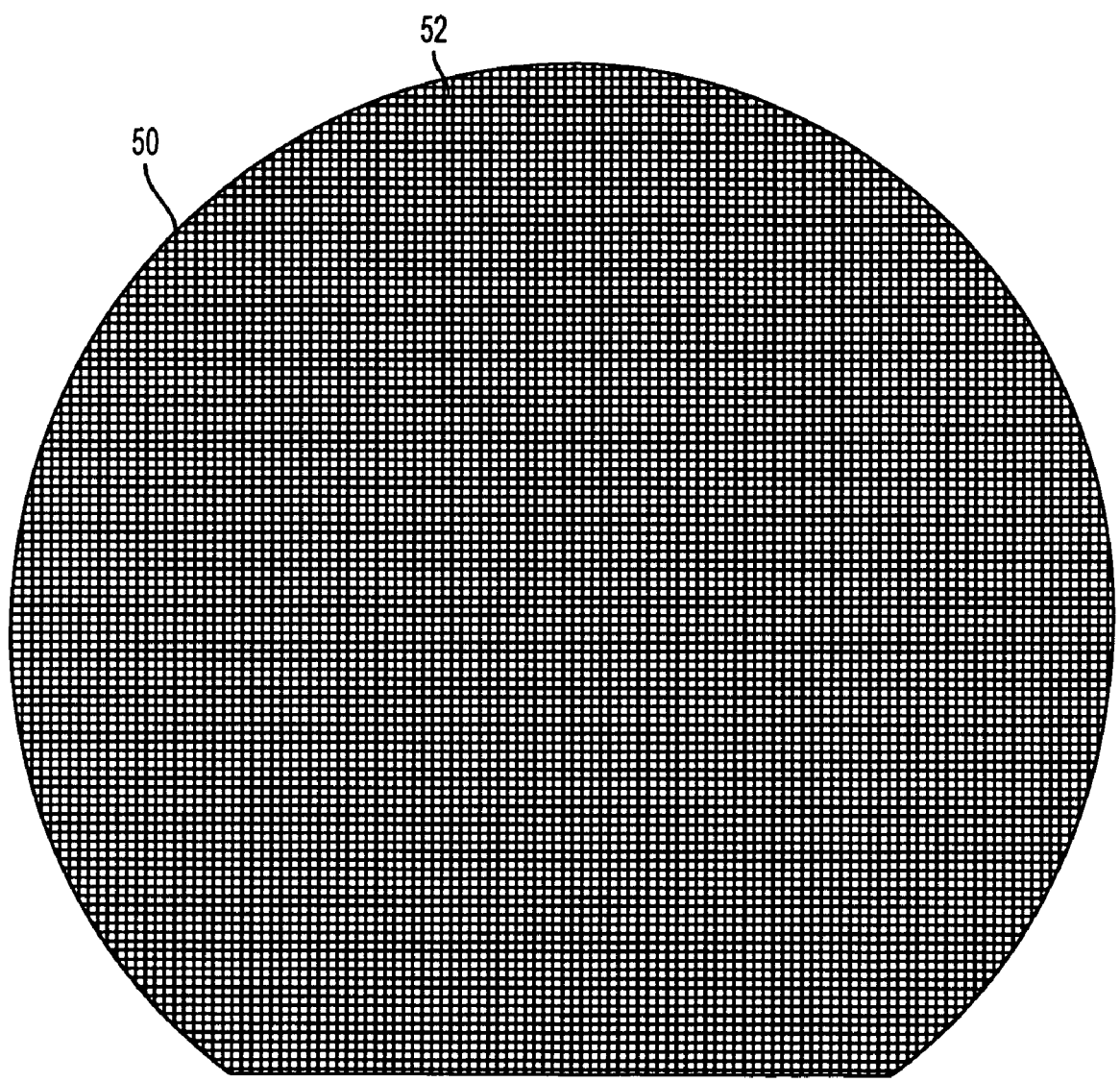
FIG. 5 is a drawing illustration of a wafer level borderless logic array.

This invention suggests a fabric of a repeating core which include logic, area I/O, and area pads. The minimum size of such core would be to fit single area pads like 3A. In most cases a larger size core would be more practical. The core 28 of FIG. 2 is about 1 mm×0.5 mm in 0.13 micron process. It would be quite possible to provide 4×2 area pads and the appropriate number of area I/O with it. Tiling such core to span a full wafer will allow a fabric of borderless logic array of about 20×40 cores 28 in one reticle. If the accuracy of the stepper is high enough, it would be conceivable that the borderless fabric could be extended up to wafer level. In such case it may require somewhat less dense lithography pitch for the routing structures, to allow spanning across reticle boundaries. The wafer level borderless fabric provides he highest level of flexibility and wafer utilization effectiveness. For the ease of description, the following detailed description of the additional preferred embodiments of this invention assumes wafer level borderless logic array. FIG. 5 is a drawing illustration of a wafer 50 comprising of wafer level borderless logic array of continuous tiling of cores 52.

Figure 3C:
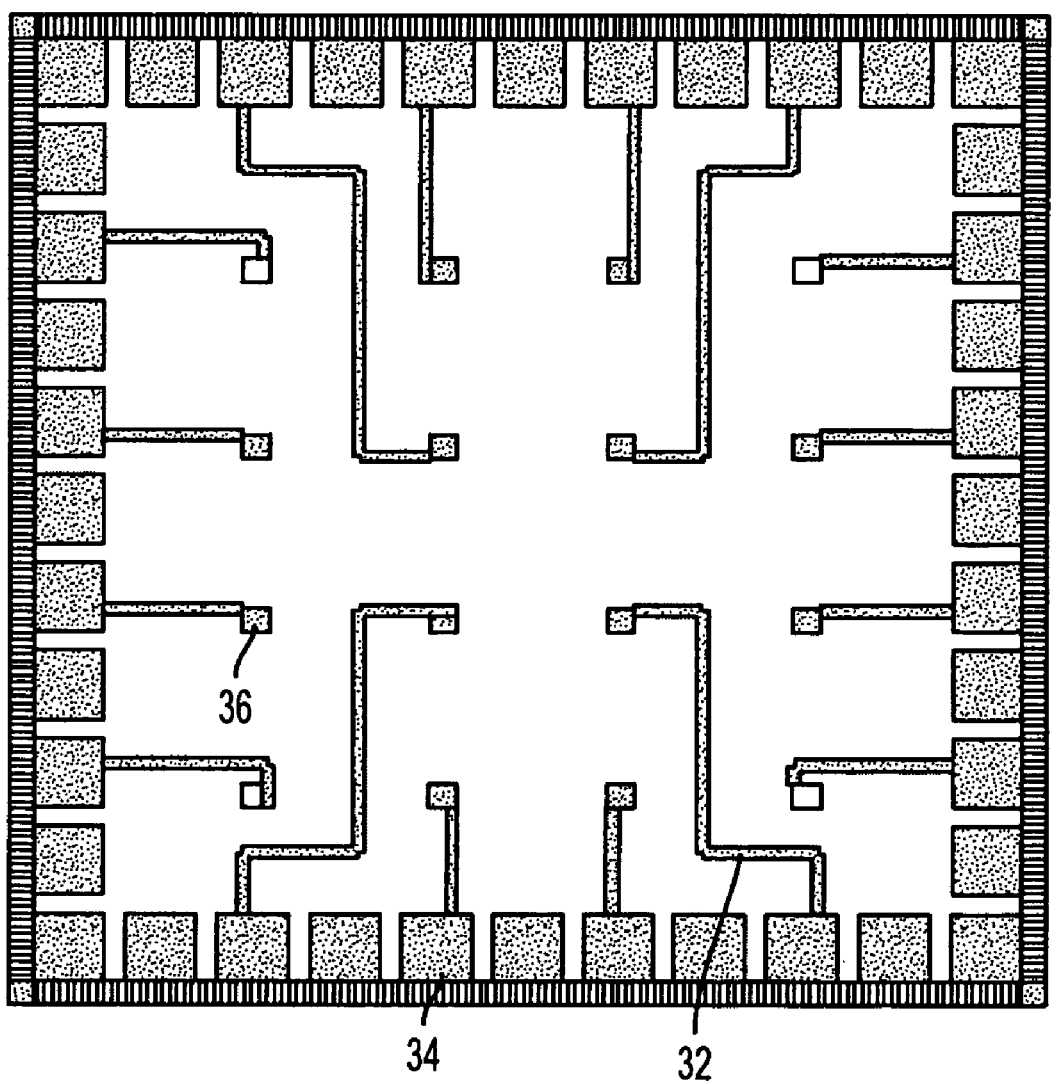
FIG. 3C is an illustration showing area I/Os connected to edge pads using a redistribution layer.

The redistribution layer may also be a custom layer. It could therefore be custom designed to redistribute the area I/O to the edge pads in a specific design and therefore allow such custom design to be packaged using conventional bonding rather than Flip-chip. FIG. 3C illustrates the use of redistribution layer 32 to connect area I/O 36 to edge pads 34 so wire bonding could be used. The redistribution layer may also redistribute the area I/O so area-array wire bonding could be used.

Figure 6:
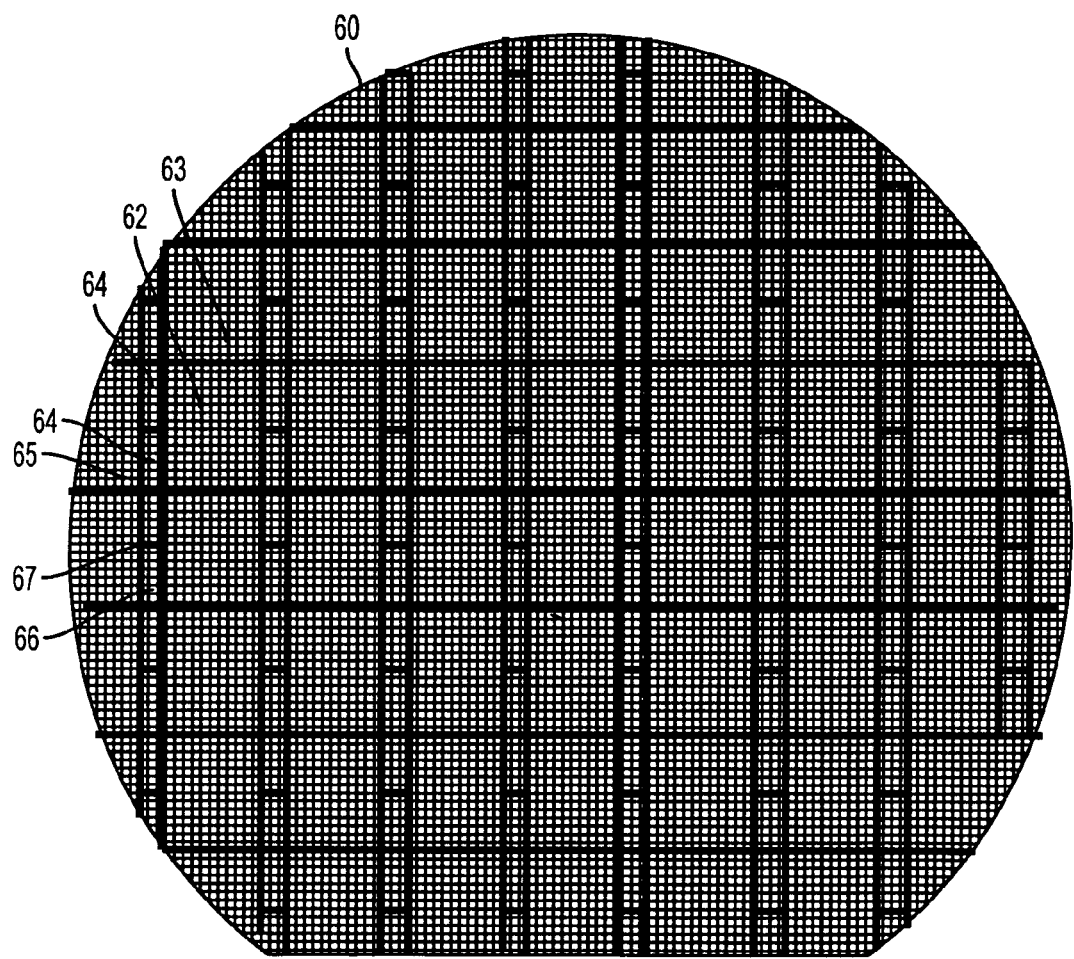
FIG. 6 is a drawing illustration of a wafer shared between two applications utilizing reticle sharing.

FIG. 6 is a drawing illustration of a wafer shared between two designs utilizing reticle sharing. FIG. 6 illustrates the existing art of reticle sharing wherein one reticle may include design A' 62 which is placed and routed on the logic array and occupies a large portion of the reticle, and design B' 64 that is smaller and could be placed two times within the reticle, so together with design A' the reticle is fully utilized. Design A' edges are marked by marks 63 and 66 and design B' edges are marked by marks 65, 66 and 67.

It might be highly desirable to have these edges 63, 65 marked by lithography and, following process to allow proper dicing of the wafer. Such marking would be best done at the top or very close to the top layer and prior to the bump processing step. Such marking step is not usually required for logic array where the master slice are arranged for specific array size, and where the boundary pads, together with the space between devices, make it very visible where dicing should take place.

It is clear that conventional saw dicing would be proper for dicing the wafer 60 from design A' point of view. Yet the edge 67 should be left for dicing at a later stage to separate the two dies of design B'.

The current invention provides the ability to size each design independently and to mix different designs on single wafer. Constraining dicing along straight continuous lines places a strong limitation on the ability to share one wafer with multiple-sized designs. It is therefore suggested to use laser dicing for wafers fabricated according to the current invention. Laser dicing is being developed and offered by few companies such as DFL7160 made by Disco Corporation Tokyo, Japan, and Multidice made by NanoVia, LP of Londonderry, N.H. Thinning the back of the wafer may be required so laser dicing would allow for a full cut rather than just scribing.

Figure 7:
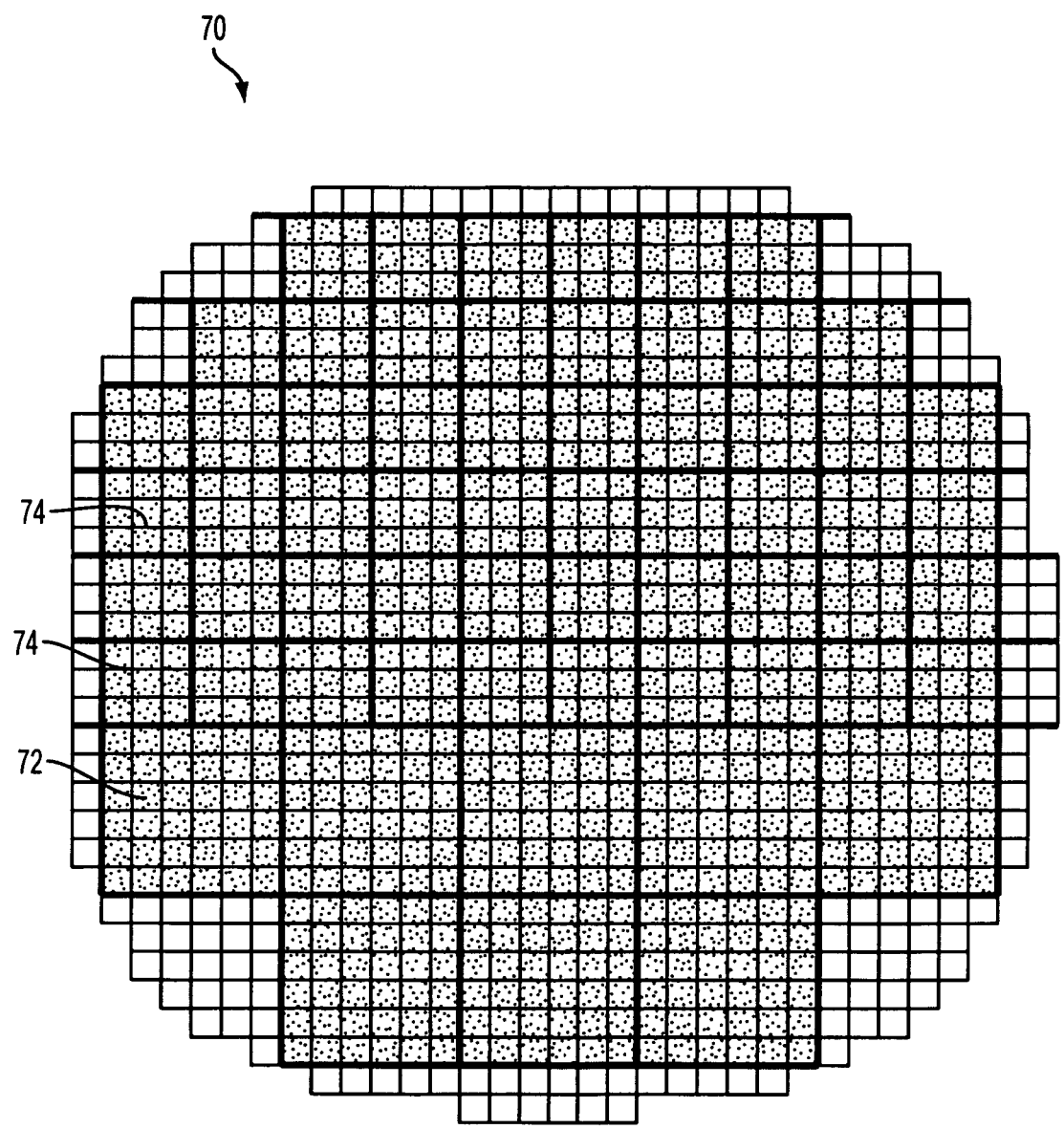
FIG. 7 is a drawing illustration of a wafer shared between two applications.

In another embodiment of the current invention, a very flexible wafer sharing is suggested. Such wafer sharing provides much higher flexibility than reticle sharing. FIG. 7 is a drawing illustration of a wafer shared between two applications taking advantage of the borderless array, together with the use of direct-write for wafer level lithography. It is therefore possible to mix different designs at various quantities on such wafer. FIG. 7 illustrates design 72 placed for prototype stage, while another design 74 is placed many more times. Unlike the case with reticle sharing, the locations and the number of times one design is placed on a wafer has little bearing on the other design. An important advantage of this invention is that the location on the wafer in which one design is placed, is independent to the location on the wafer in which a second design is placed, other than the obvious limitation that it can not be placed in location already taken by the first design. More importantly, the number of times one design is placed is independent to the number of times the other design is placed.

Figure 8:
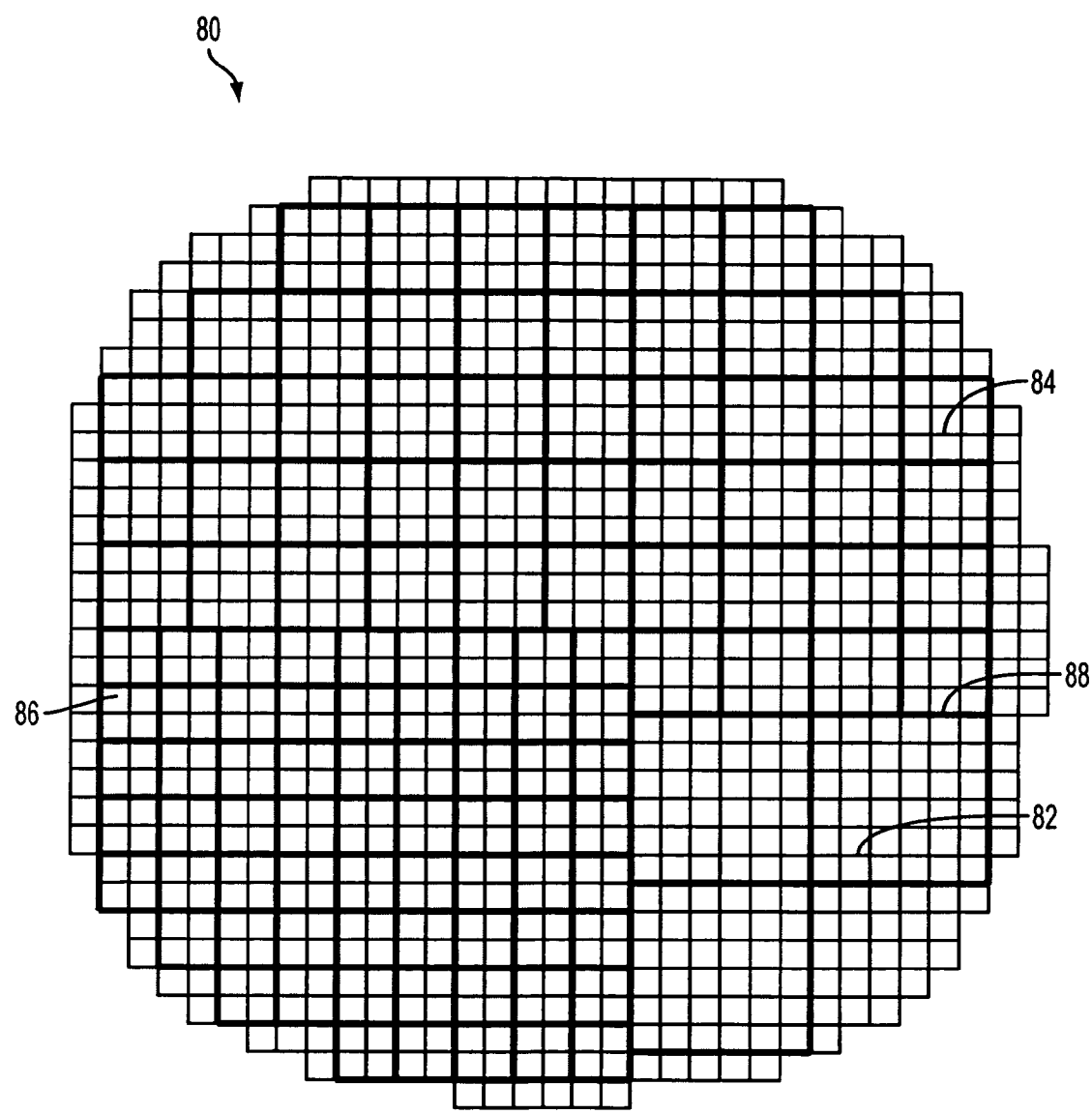
FIG. 8 is a drawing illustration of a wafer shared between three applications.

FIG. 8 is a drawing illustration of a wafer 80 shared between three applications. Design 82 has three sites on the wafer, which represent prototype level. Designs 84 and 86 have tens of locations assigned to them. It is clear that the location and the number of sites for design 86 are independent on those of design 82. In addition it should be noted that many of the dicing lines 88 do not extend from one edge of the wafer 80 to the other edge. Dice lines 88 do not fit saw dicing, but rather require the use of a flexible dicing approach such as laser dicing.

Many logic arrays are now offering logic fabric with additional functional blocks such as memory blocks, processors or special elements like PLL. Typically the embedded memory takes the second largest portion of the master slice area after the logic array. In general embedded memories are constructed as a small array of configurable memory blocks. The custom design may need certain amount of memory or some number of PLL and so forth. It is an increasing challenge to select the right master-slice combination, since designs with similar amounts of logic may require very different amounts of memory.

In yet another embodiment of the current invention, the continuous logic array fabric is comprised of a continuous logic array and continuous memory array of small memory blocks. It therefore now possible that a specific design will be placed on a section of such continuous fabric, sized to have exactly the desired amount of logic and the desired amount of memory.

Figure 9A:
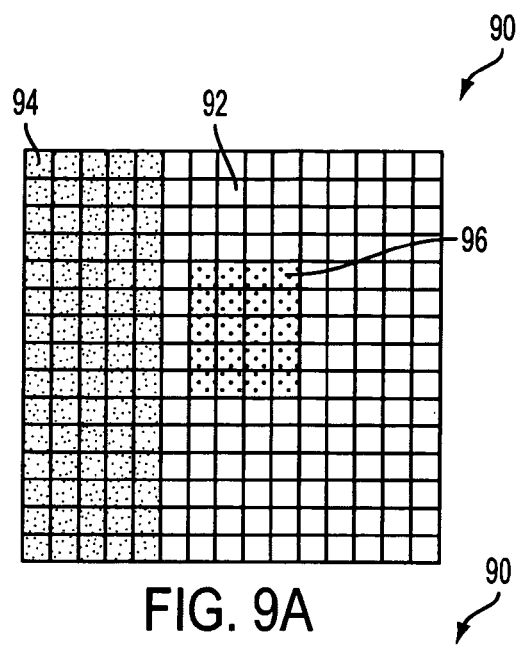
FIG. 9A is a drawing illustration of a reticle fabric.
Figure 9B:
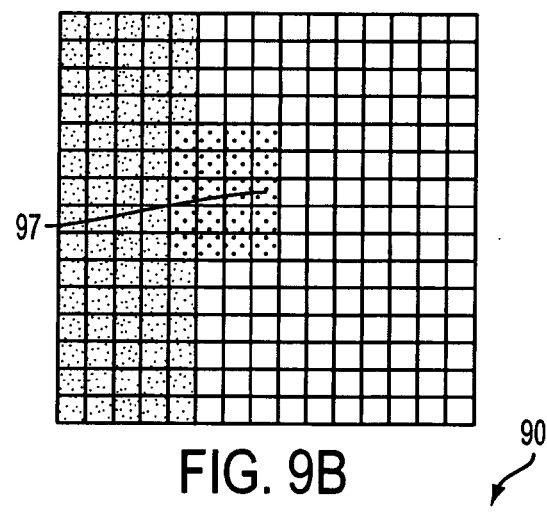
FIG. 9B is a drawing illustration of a reticle fabric.
Figure 9C:
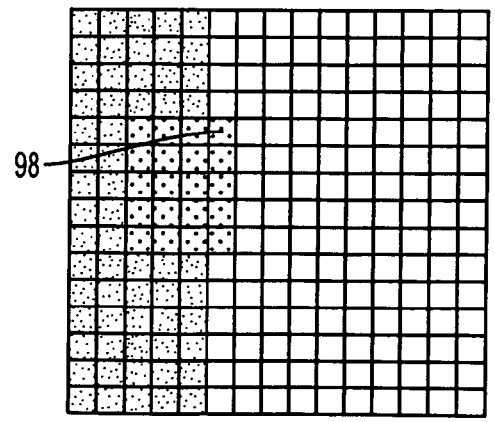
FIG. 9C is a drawing illustration of a reticle fabric.
Figure 10A:
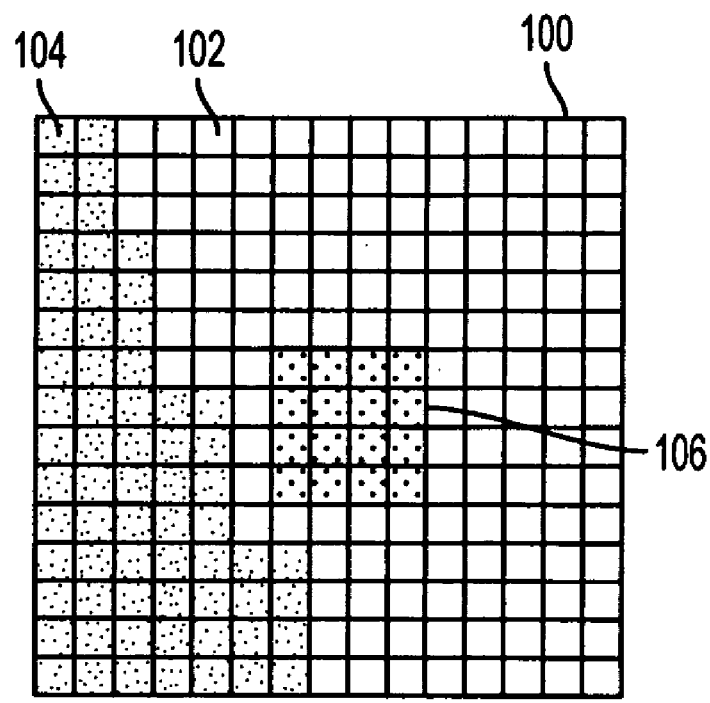
FIG. 10A is a drawing illustration of a reticle fabric.
Figure 10B:
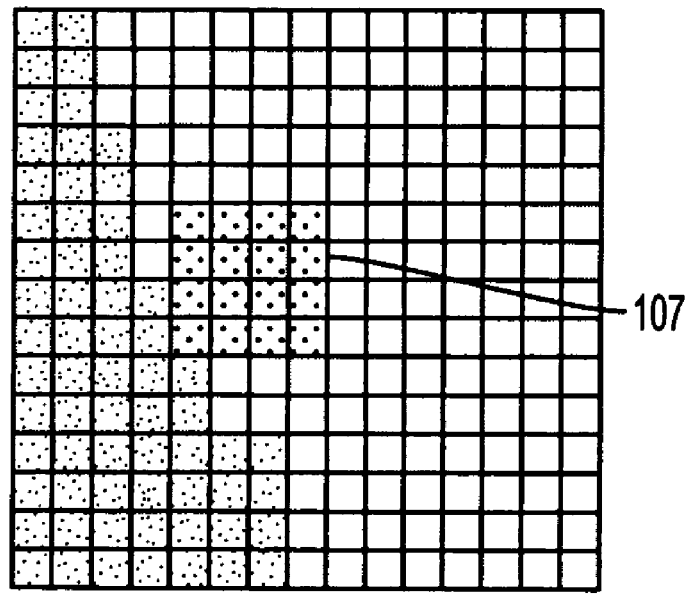
FIG. 10B is a drawing illustration of a reticle fabric.

FIG. 9 is a drawing illustration of a reticle 90 fabric comprising of continuous logic array 92 and memory array 94. FIG. 9A illustrates a custom design placed on such terrain as marked by the rectangle 96 to have no memory. FIG. 9B illustrates a custom design placed on such terrain as marked by the rectangle 97 to have some memory. FIG. 9C illustrates a custom design placed on such terrain as marked by the rectangle 98 to have a small amount of logic and all the rest being memory. FIG. 10A is a drawing illustration of a reticle fabric 100 wherein the memory terrain 104 is shaped in a staircase manner. FIG. 10B illustrates that such staircase arrangement provides a higher level of flexibility with regards to the amount of memory blended into the rectangular markings of the custom design.

The advantage of continuous terrain is the ability to use one set of generic masks to cover many variations of product fabrics, with the ability to tailor the right amount of logic with the right amount of memory. The additional advantage is the ability to use one wafer run to make a flexible mix of custom products. It is usually highly desirable to utilize the silicon area as effectively as possible. Yet it may often happen that by tailoring the amount of logic and memory to the need of a specific design, the tiling efficiency is compromised. The number of devices on one wafer would be at least the number of times the reticle is stepped over the wafer. If high volume production is required then custom masks could be fabricated so volume production would be done at maximum silicon utilization.

Figure 11:
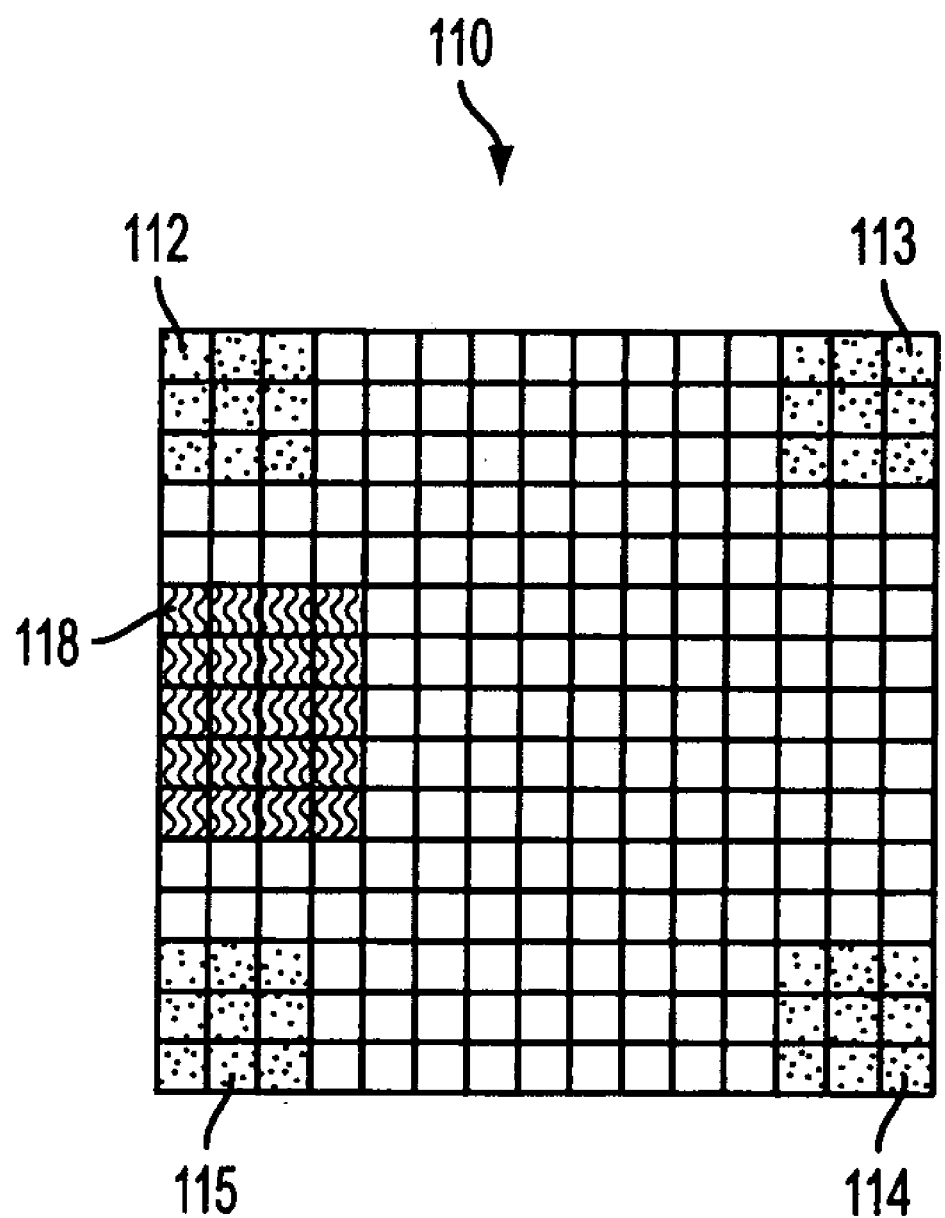
FIG. 11 is a drawing illustration of a reticle fabric.
Figure 12:
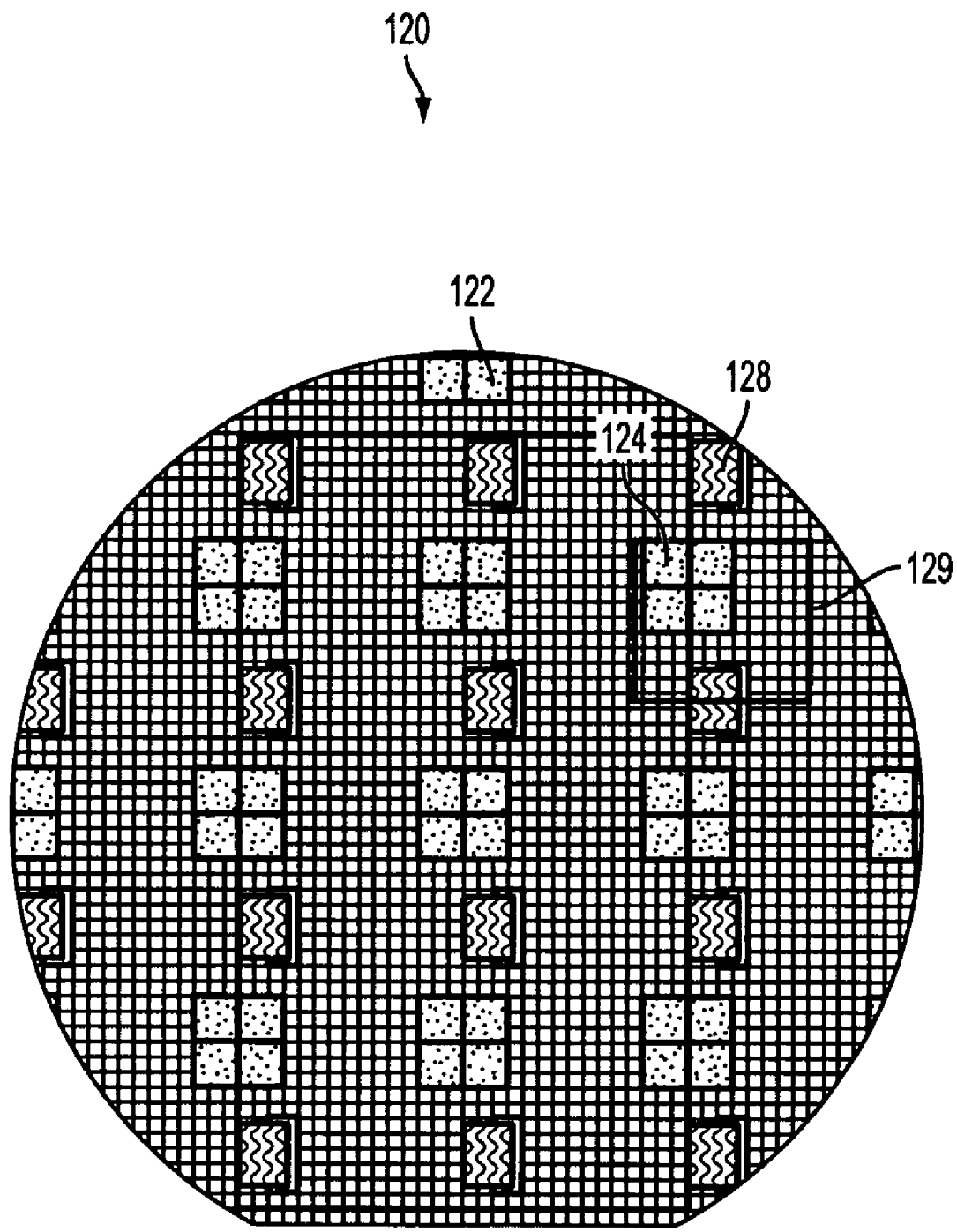
FIG. 12 is a drawing illustration of a wafer marked with reticle projections.

FIG. 11 is a drawing illustration of a reticle 110 of a logic array that in addition to array of logic fabric comprises additional functional logic elements like processor blocks 112, 113, 114, 115 and memory array 118. FIG. 12 is a drawing illustration of a wafer 120 marked with reticle 110 projections. FIG. 12 illustrates the use of the wafer terrain to carve out specific design 129 to include elements from four different reticle projections 124—four processors with a portion of the memory array 128. By proper placing a specific design 129 on the wafer terrain, it is possible to optimize the silicon area and yet provide a different mix of elements from one generic fabric.

Figure 13:
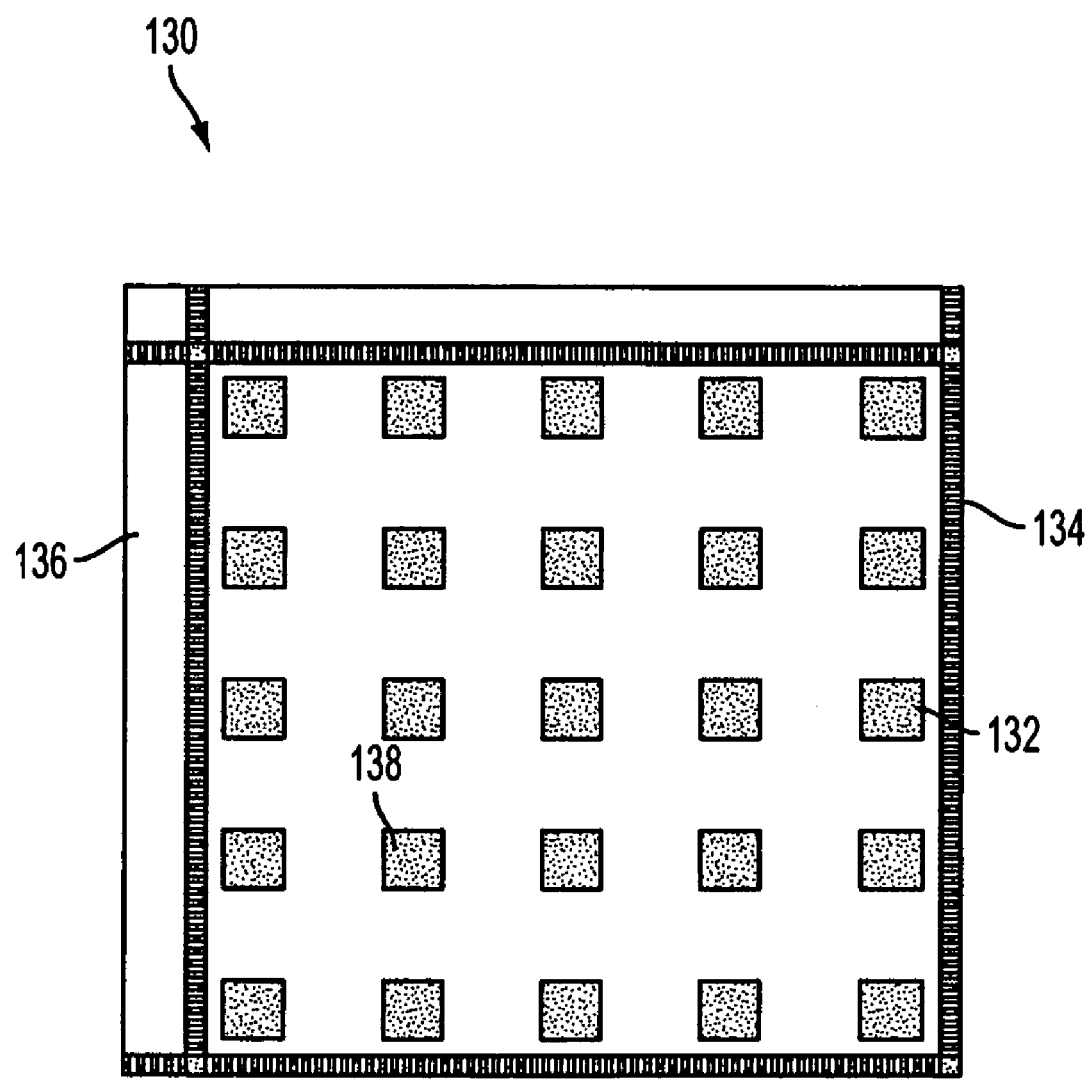
FIG. 13 is a drawing illustration of a module.

The construction of borderless logic array according to the current invention should include consideration for wafer dicing. The common way is to draw a scribe line indicating were the wafer should be scribed, to allow the dicing of the wafer into many individual dies. Typically a laser scribe can cut a 50 microns wide width, but it may be preferred to plan for scribing width between 75 to 100 microns wide. Preferably the continuous array is constructed as array of modules. A preferred module is rectangular with each side sized between 0.5 to 2 mm. A module could be array of logic or array of memory or combination thereof, which may include other special function like PLL. A preferable location for scribe lines is the edge of such module. The location for potential scribe line may include transistors, which would not be powered if that scribe line is used for dicing. Alternatively it could be designed so only connectivity structures are placed in the scribe lines designated areas. FIG. 13 is a drawing illustration of a module 130 with designated area for scribe line 136 and customizable connection 134 to the scribe line routing fabric (not shown). The customizable connection 134 allows disconnection from the routing fabric at the scribe lines area, if that potential scribe line is designated for dicing. The repeating module 130 comprises of pads 132 for the I/Os that are included in the module 130 and pads 138 for the supply powering the circuits within the module.

Figure 14:
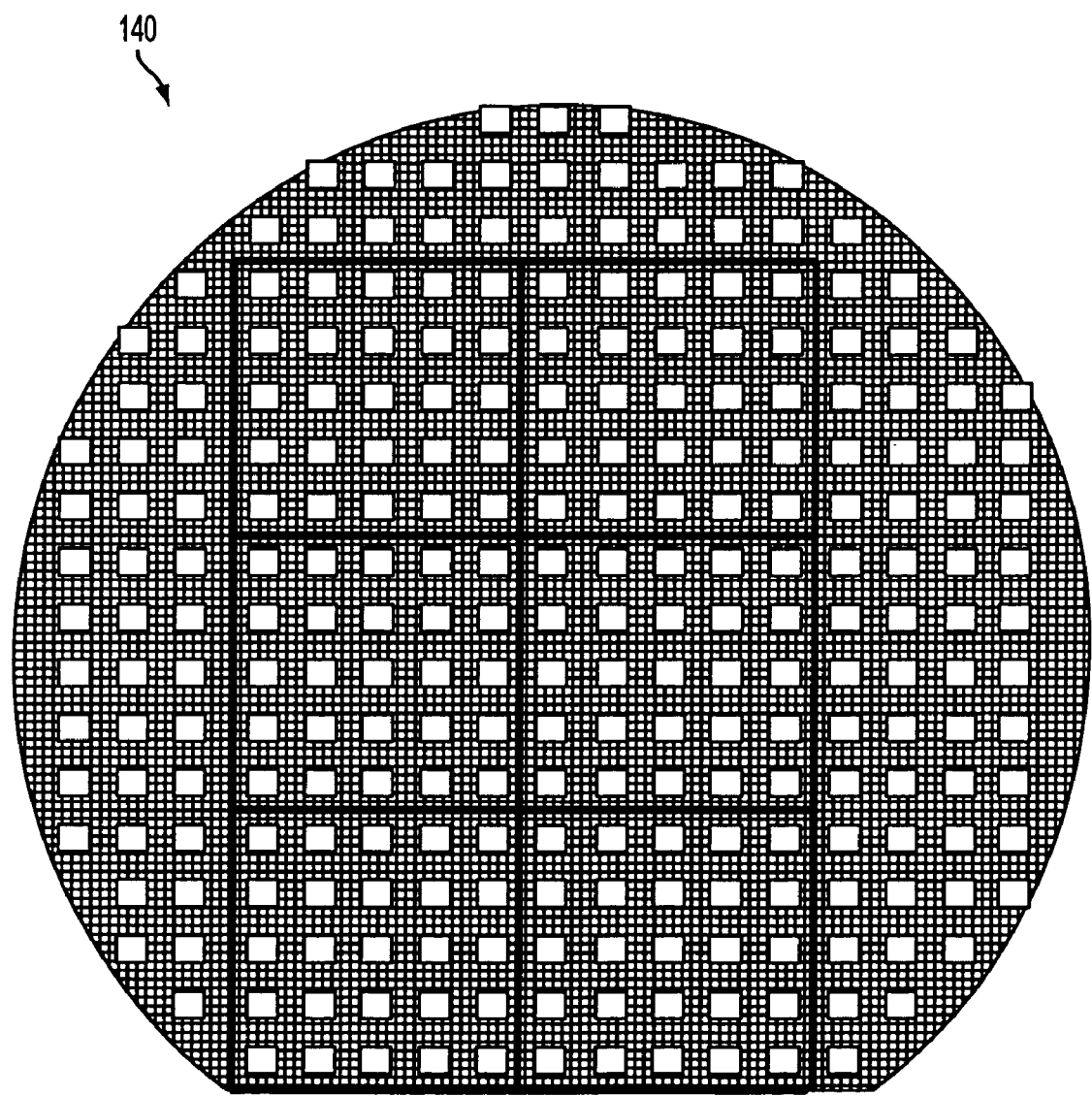
FIG. 14 is a drawing illustration of a wafer comprise wafer level borderless logic array covered with Area Pads.

Yet another advantage of the current invention is the possible use of single Probe Card for multiple designs. FIG. 14 is a drawing illustration of a wafer comprised of wafer level borderless logic array covered with Area Pads. The pads area of the wafer is uniform and is independent of the specific design size and placement. With such regularity, it is possible to construct single probe card to allow testing of the wafer by stepping over it. Under proper software control a single Probe Card could be used to test any device on the wafer 140. Similarly, it is also contemplated that a single Probe Card may be used to simultaneously test multiple dies on the wafer, or with the proper test logic, test a die with more area pads than probes on the Probe Card.

The current invention is not limited to products that combine generic layers with custom layers. Rather it could be use to build a borderless FPGA product. A borderless FPGA wafer could than be diced to provide many options of gate count and block memory size from one base mask-set.

Another use of the current invention is to yield a very large device. Very large devices are subject to very low yield, which make them economically unviable. Under the current invention yield can be improved if the following procedure is applied:
(1) Test the substrate layers prior to the custom masks. This implies that each module is independently tested. To do this there need to be pads dedicated to some functions like clock, scan-in, scan-out, and test control. Probe technology exists to probe pads as small as 20×20 microns with minimal damage, though special alignment equipment will probably need to be integrated into existing standard Probers.
(2) Place the specific design so as to avoid faulty substrate cells. This requires a special placement program, to make the best use of the available wafer area given the outstanding orders of dies to manufacture. Presumably this also controls the designation of the direct write of the adapted for yield custom via patterns.
(3) Dice the wafer accordingly.

The resulting system should provide significant yield improvement over existing techniques. Rough analysis suggests that pre-testing and dynamic placement of die can double the revenue per wafer over conventional techniques, if a sufficiently wide range of die sizes are required for production. It should also be noted that, as with the other techniques above, larger dies than such as are currently possible with existing stepper technology could be produced. In that case the described yield enhancement is crucial.

It is further contemplated that the dedicated pads needed for testing may or may not coincide with the area pads as shown in FIG. 3c. It is also contemplated that the pads necessary for testing may have the same configuration regardless of the type of module, such that the probe card may be configured to simultaneously probe any combinations of modules at a time.

In another embodiment, test, power, ground and clock logic may be tied together at the wafer level, such that a single probe of the wafer is sufficient to test all of the modules within the wafer. Subsequent customization and scribing then isolates the power, ground, test and clock logic to specific modules and dies, to reduce the need for special pads, and pre-customization test time.

Figure 15:
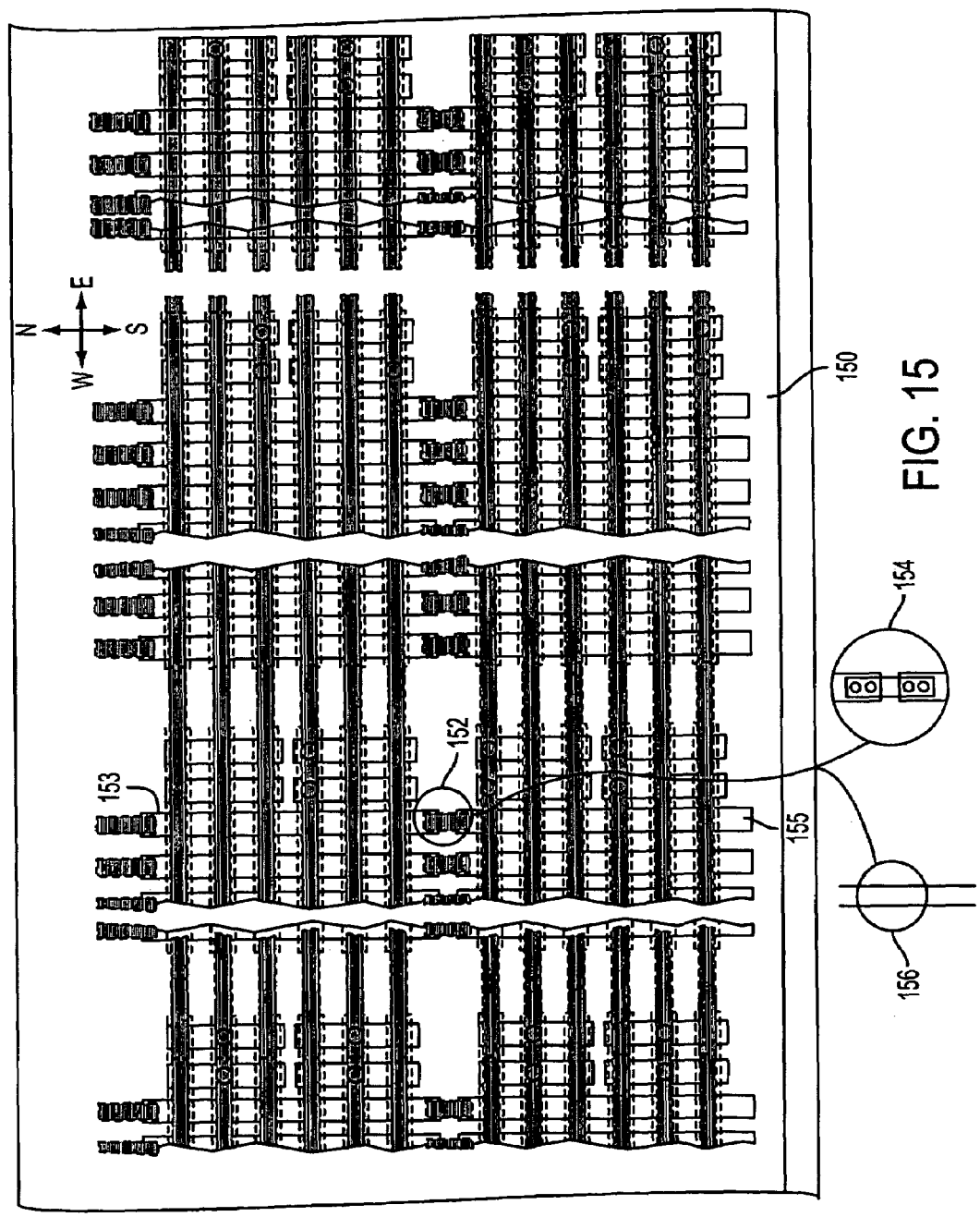
FIG. 15 is a drawing illustration of via customizable routing structure.

FIG. 15 is a drawing illustration of via layer customizable routing structure 150. In some fabrication processes a via layer might have reduced yield. A variation of the structure 150, that uses double via for the continuation bridges 154 instead of single via 152, could be an effective solution. Via customizable routing fabric increases the use of vias primarily in the form of same direction connections utilizing small bridges. Therefore bridges employing double vias are an effective solution. It should be pointed out that double via bridges imply cost, by reducing the number tracks available for routing.

An alternative solution could be employed for volume production. It suggests that in addition to the custom via layer, the two metal layers could use custom mask that connect the segments 153, 155 with the same metal layer 156.

For volume production additional yield enhancement technique could be employed. For example, a software routine can inspect the custom design and replace any single via with a double via where possible. Having most of the patterns in an array form with a highly repetitive structure make it very friendly to employment of yield enhancements. It is possible to keep track of yield loss in production of specific designs that utilize the same logic array fabric. Any failure mechanism could then be reviewed for yield enhancement. The yield enhancement may involve changing the layout of the generic logic array and therefore replacing some of the generic masks.

Figure 16:
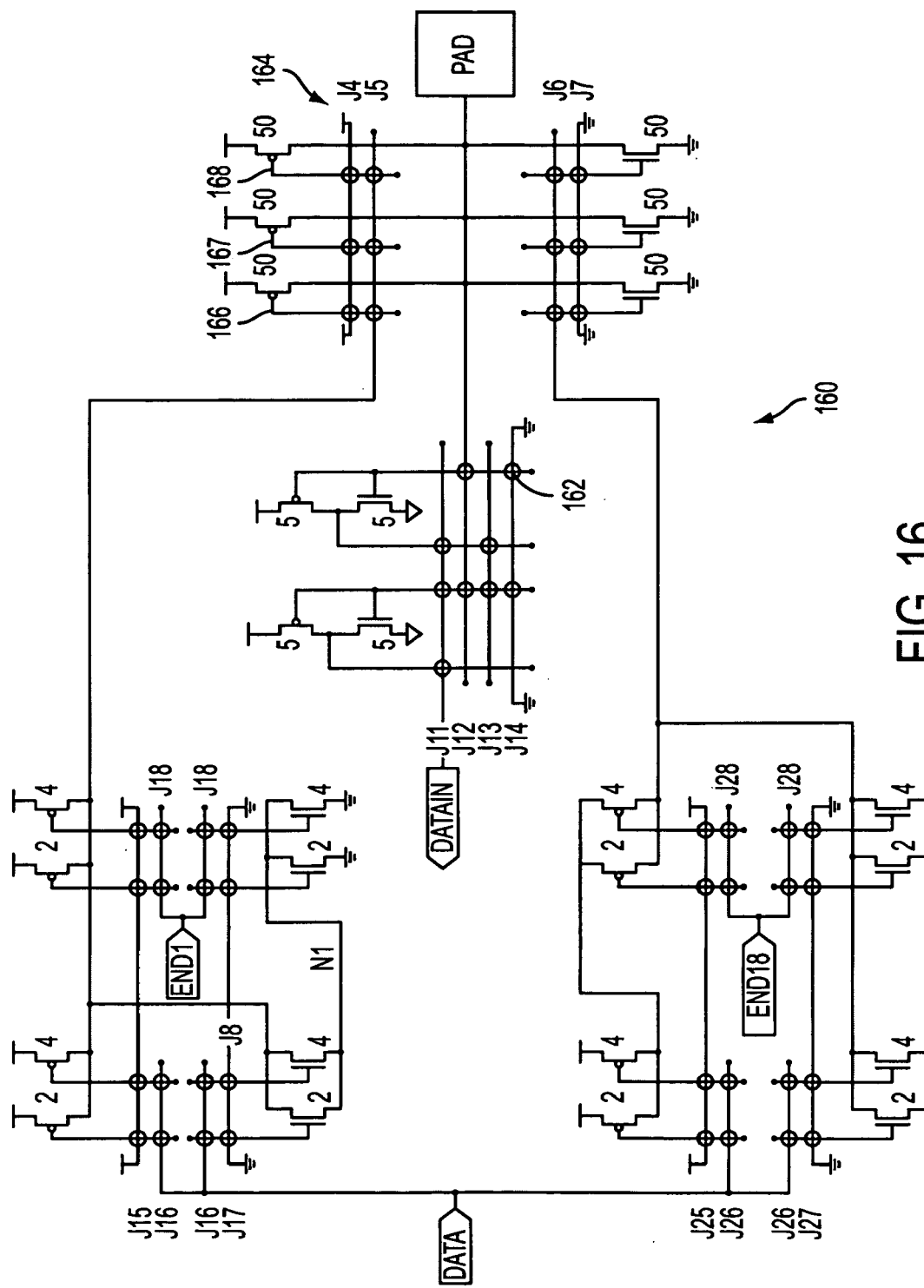
FIG. 16 is a drawing illustration of via customizable I/O.
Figure 17:
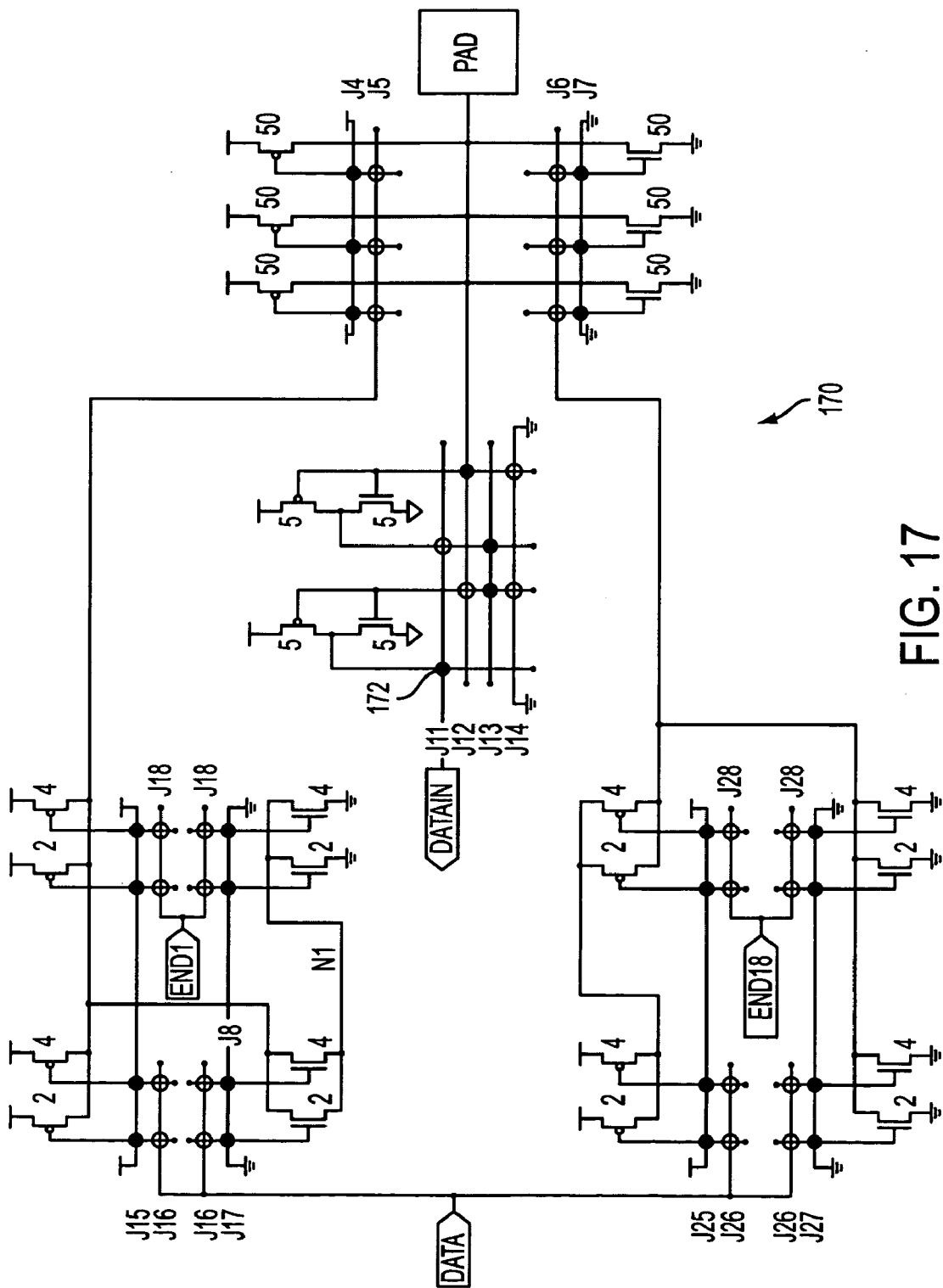
FIG. 17 is a drawing illustration of via customizable I/O customized as input.
Figure 18:
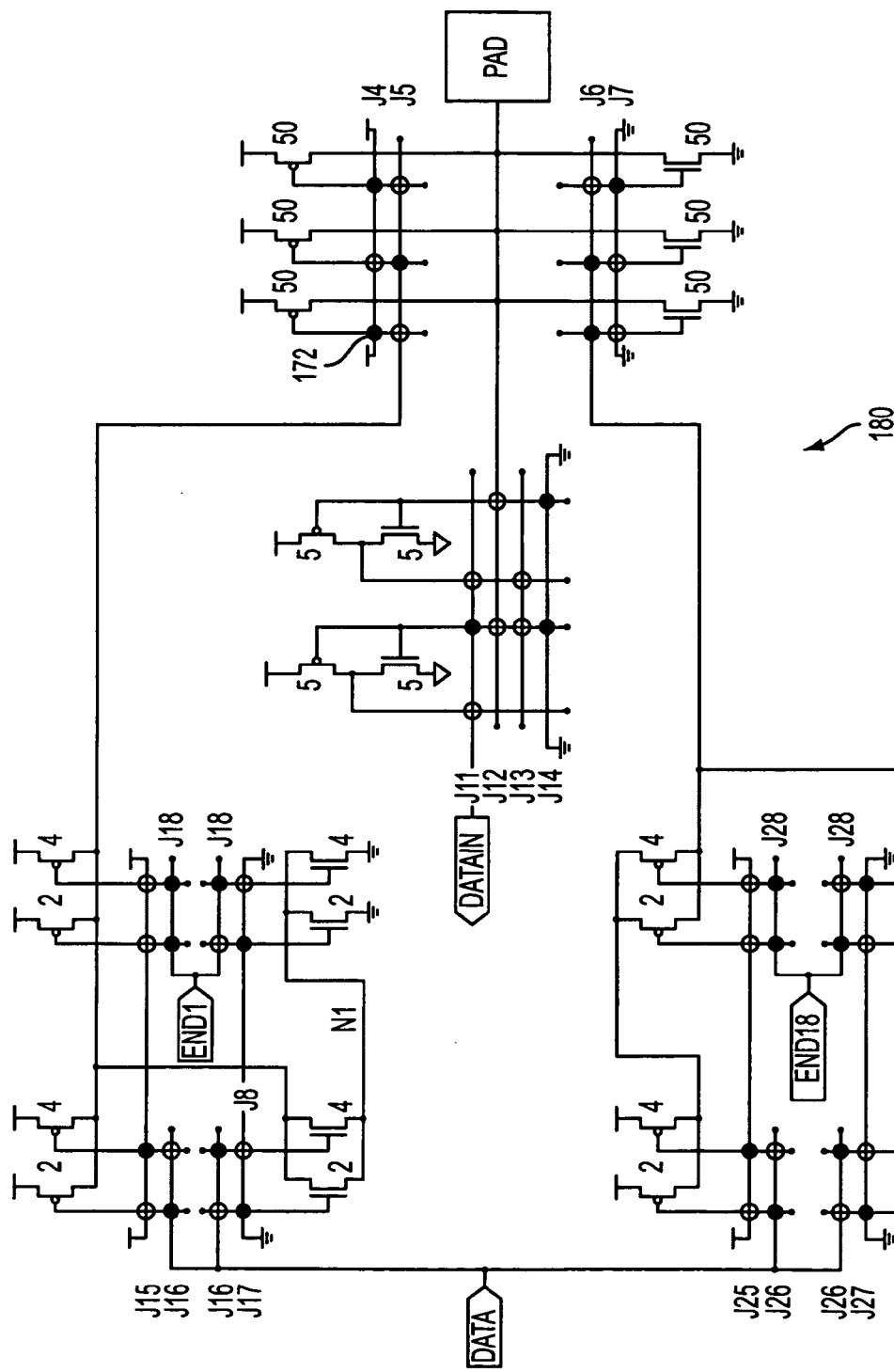
FIG. 18 is a drawing illustration of via customizable I/O customized as output.

Reference is now made to FIGS. 16, 17, and 18 which illustrates another preferred embodiment of the current invention. These figures illustrate via-configurable I/O. Preferably the area I/O of the borderless logic array is configurable I/O. It is advantageous to many users to have flexibility of the I/O configuration, in addition to having flexibility of the logic. It is the purpose of this invention to utilize the same custom mask to configure both the core logic and the I/O. FIG. 16 illustrates a simple via-configurable I/O 160, where a circle 162 marks the potential vias. Few vias are arranged to connect a line used as a jumper, and mark such as J4 164 to the crossing line, preferably underneath 166 or 167 or 168. Different types of I/Os could be constructed by selecting some of the potential vias. FIG. 17 presents a configuration of the configurable I/O of FIG. 16 as an input cell 170. The selected vias are marked by black filled circle 172. FIG. 18 presents an alternative configuration as output cell 180.

Figure 19:
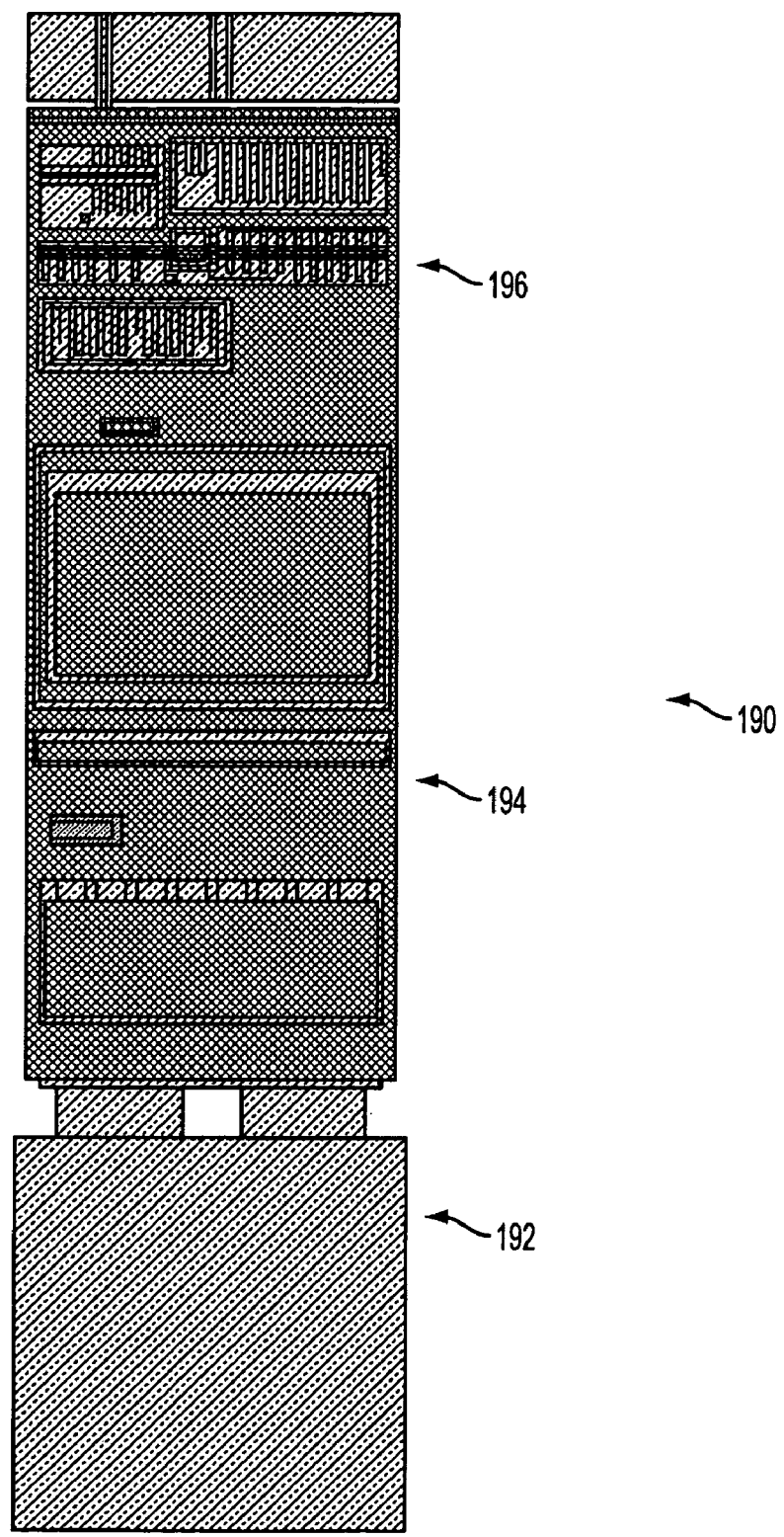
FIG. 19 is a layout drawing illustration of via customizable I/O.

FIG. 19 is a layout drawing illustration of via customizable I/O 190. The I/O comprises the main elements pads 192, high drive I/O section 194 and the I/O logic section 196 comprising the pre-driver circuits.

Figure 20:
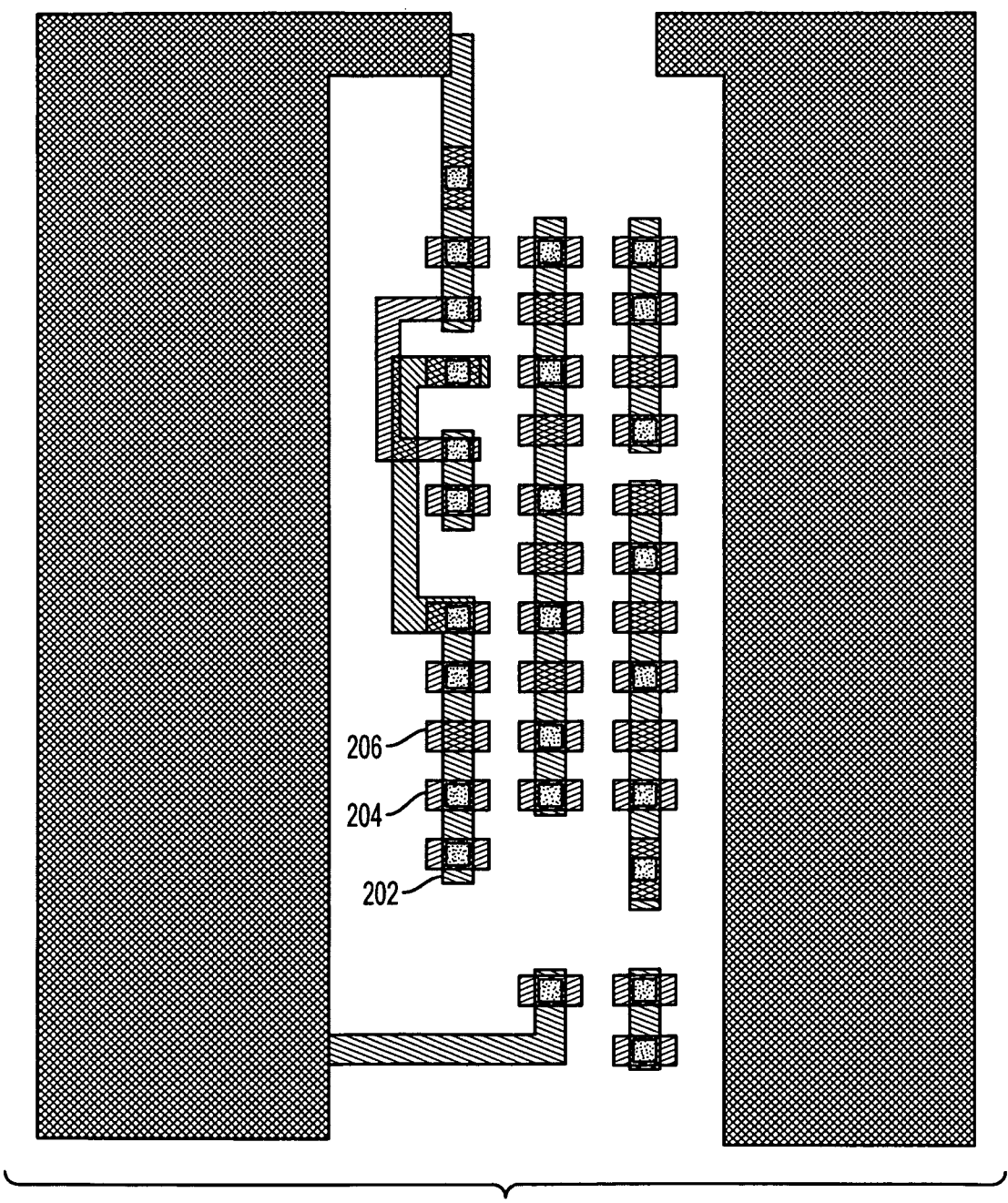
FIG. 20 is a layout drawing illustration of a small section of via customizable I/O.

FIG. 20 is a layout drawing illustration of a small section of the via customizable I/O, illustrating a jumper 202 with an activated via 204 and a not activated via 206.

In another embodiment I/O may be comprised of many input 163, output 165 or pre-driver 161 cells such that most I/O types could be constructed by interconnecting to one or more of these cells by providing additional segments between cells for via programming. It is further contemplated that many more I/O cells 26 exist in each repeating core 28, FIG. 2 than area pads in each repeating core, to allow flexible programming of each repeating core's I/O pads.

Another preferred embodiment of the current invention is the enhanced via-configurable I/O. The enhanced via-configurable I/O is defined as an I/O device that has the possibility of implementing multiple I/O standards with either single ended output/single ended input (like LVTTL/LVCMOS, etc.) or single ended output/ voltage referenced input (like HSTL, etc.) or differential output/differential input (like LVDS, LVPECL, etc.) and can be configured to implement these functions using connections realized with a single via mask. Using the same single custom via mask as the rest of the chip, and a proper choice of supply and reference voltages, the user will be able to implement variety of I/O standards like the ones exemplified by the references above.

Figure 32:
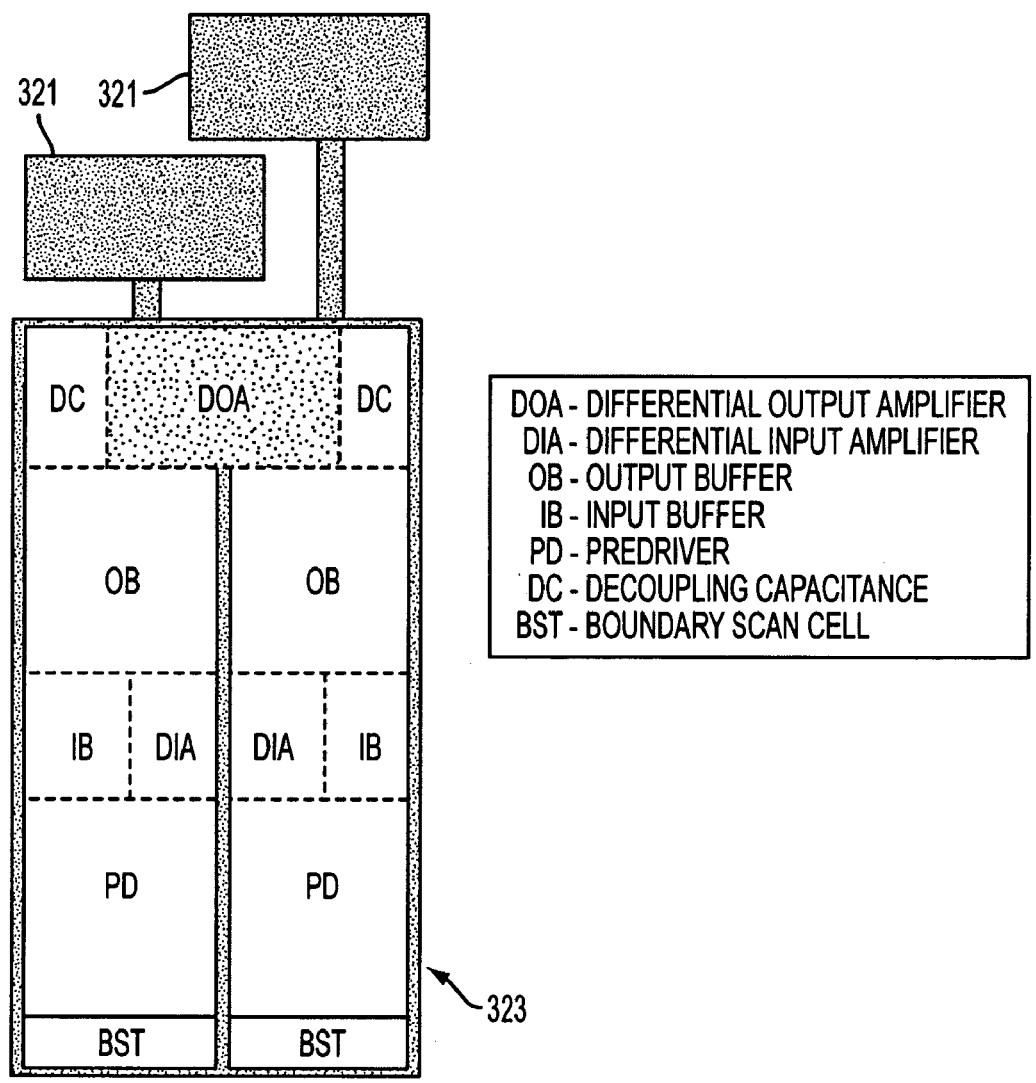
FIG. 32 is a drawing illustration of pair of customizable I/O floor plan.

FIG. 32 is an illustration of a floor plan of such I/O arranged for staggered pad bonding. The floor plan shows two I/O circuit 323 each with its own pad 321. Each I/O can function as individual I/O, or both can function as a pair for differential I/O standards.

Figure 26:
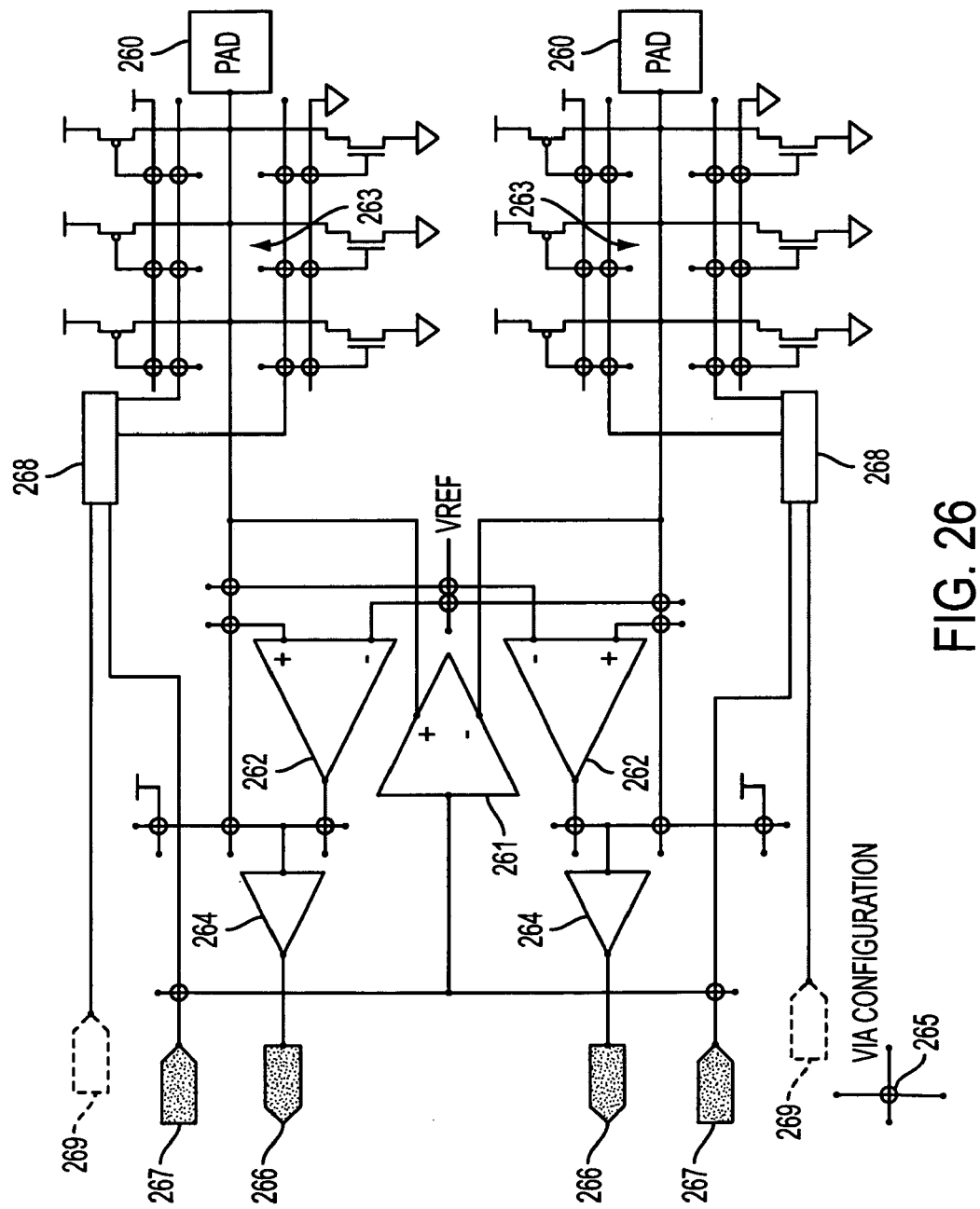
FIG. 26 is a drawing illustration of pair of customizable I/O.

Because the enhanced via-configurable I/O can implement also differential standards it is necessary that it connects to two pads (see FIG. 26. elements 260). When single ended input, single ended output or voltage referenced input standards are implemented, both pads 260 will carry individual signals. When differential input or differential output standards are implemented, both pads 260 will carry a single logical signal. As shown in the FIG. 26 the enhanced via-configurable I/O contains: a differential output amplifier 261, two differential input amplifiers 262, two output buffers 263, and two input buffers 264. In a normal implementation the enhanced via-configurable I/O contains also two pre-drivers circuits 268, but their presence is not mandatory. These components can be interconnected to implement the standards as described above using single via connections marked with circles 265 on the figure. The enhanced via-configurable I/O can transport to or from chip up to two data signals; therefore we will have 2 connections 267 that will bring signals from the chip or from a previous stage of the I/O circuit, and two connections 266 that will drive signals to the chip or to the previous stage of the I/O circuit. Optionally it can also have two connections 269 for output enable.

The predriver circuit generates the control signals for the output buffer based on the data and control signals coming out from core or from a previous circuit. One implementation for the predriver circuit is presented in FIG. 39. When output enable signal 390 is active, the data at 391 will be repeated at inputs 392 of the output buffer 393 and driven to the pad 394. Otherwise, the pad 394 will be in high impedance state. The output buffer 393 is not part of the predriver but it is presented in FIG. 39 for its easy understanding. However, if no control signals exists, the predriver might be discarded and the output data signals from core can be connected directly to the control of the output driver, and this is the situation in FIGS. 27 to 31.

Figure 27:
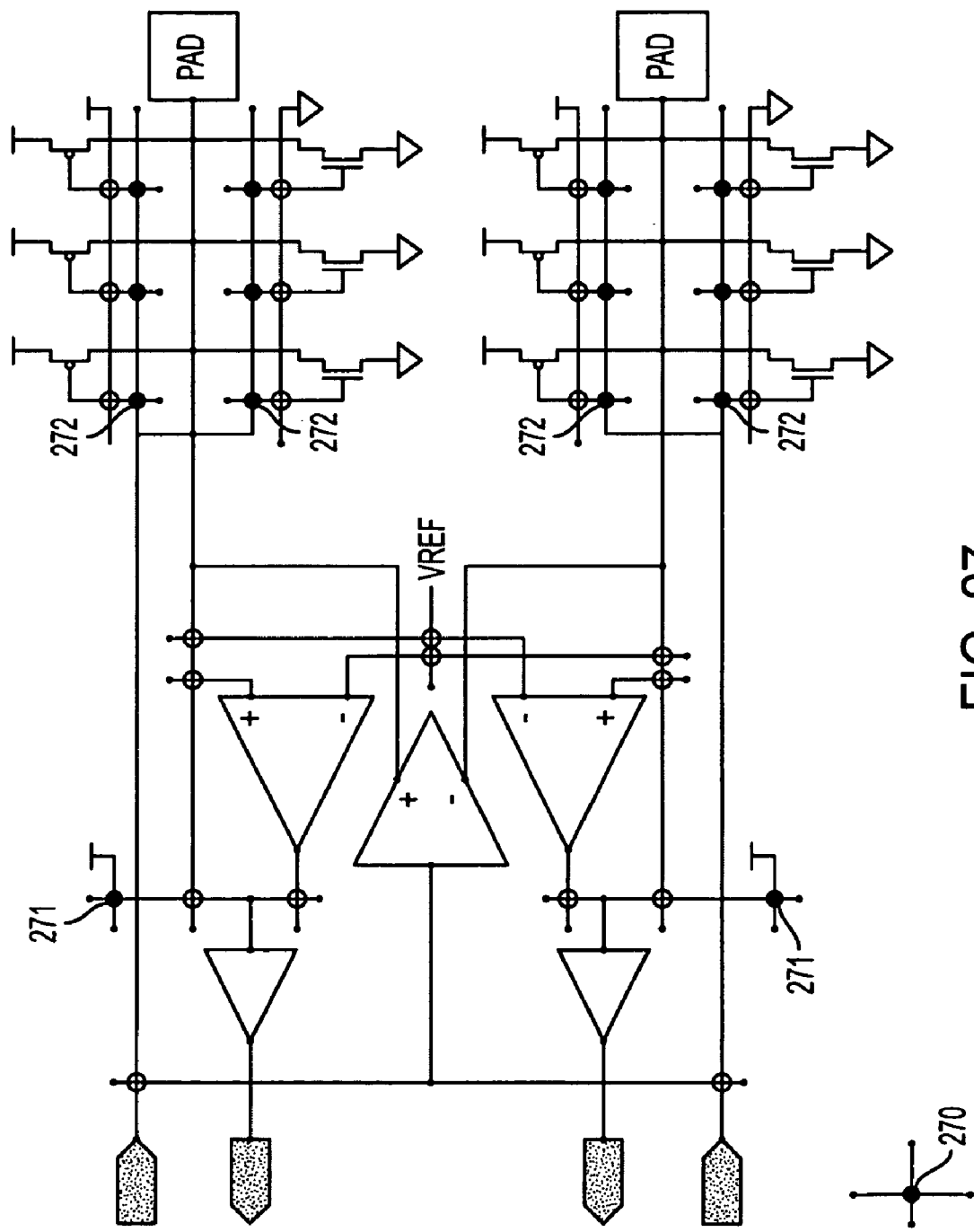
FIG. 27 is a drawing illustration of pair of customizable I/O customized as two outputs.
Figure 28:
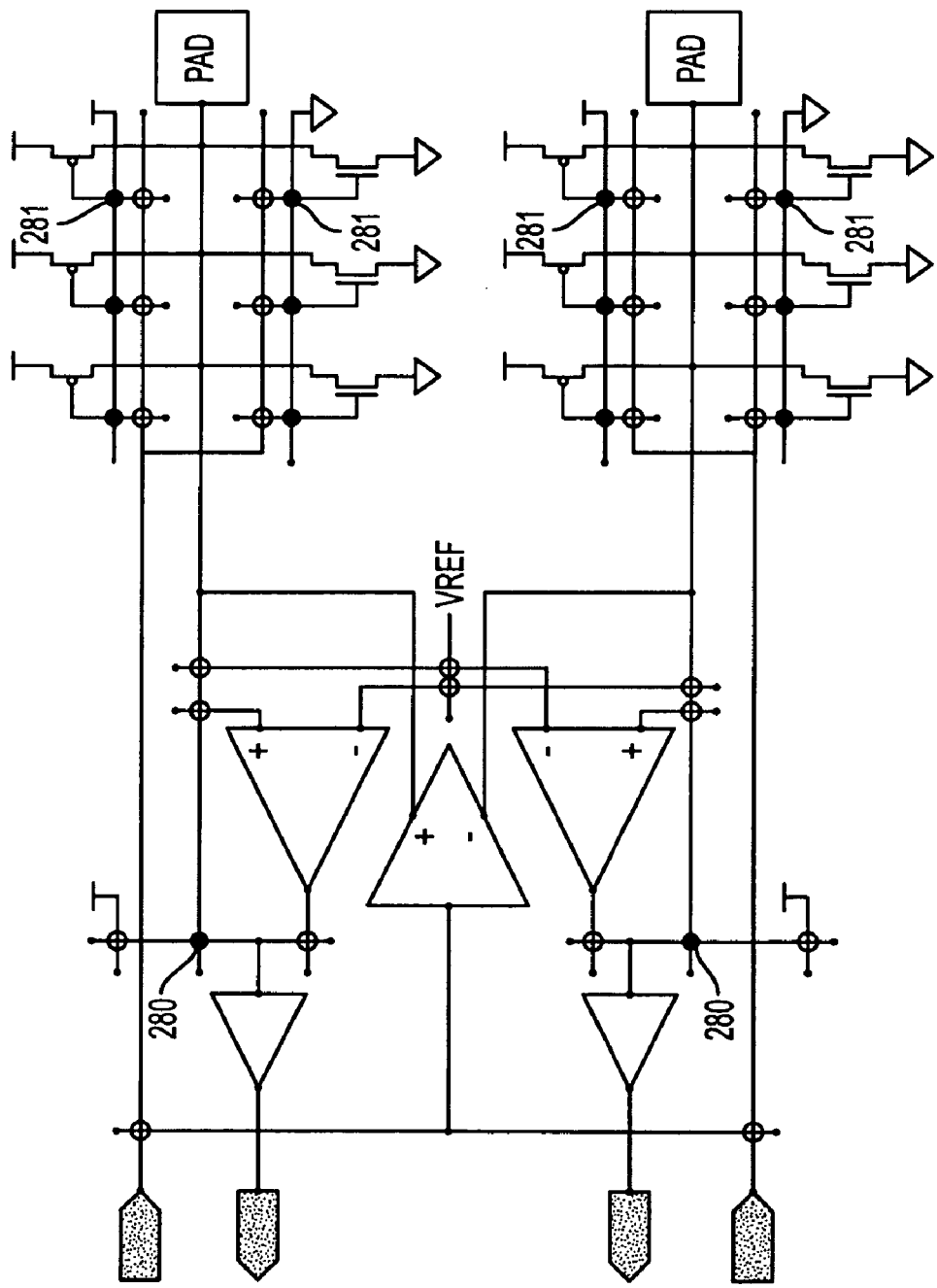
FIG. 28 is a drawing illustration of pair of customizable I/O customized as inputs.
Figure 29:
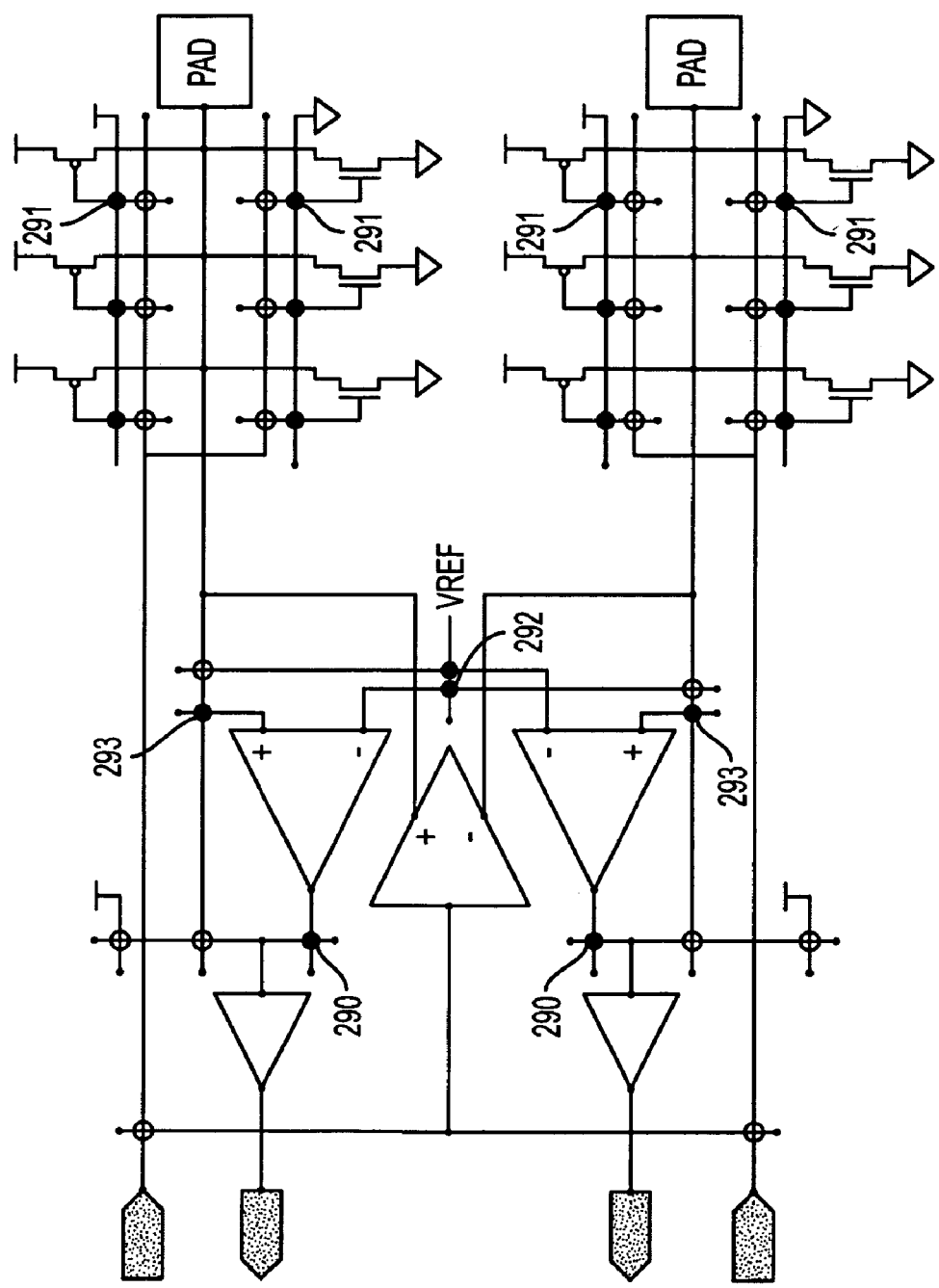
FIG. 29 is a drawing illustration of pair of customizable I/O customized as differential inputs.
Figure 30:
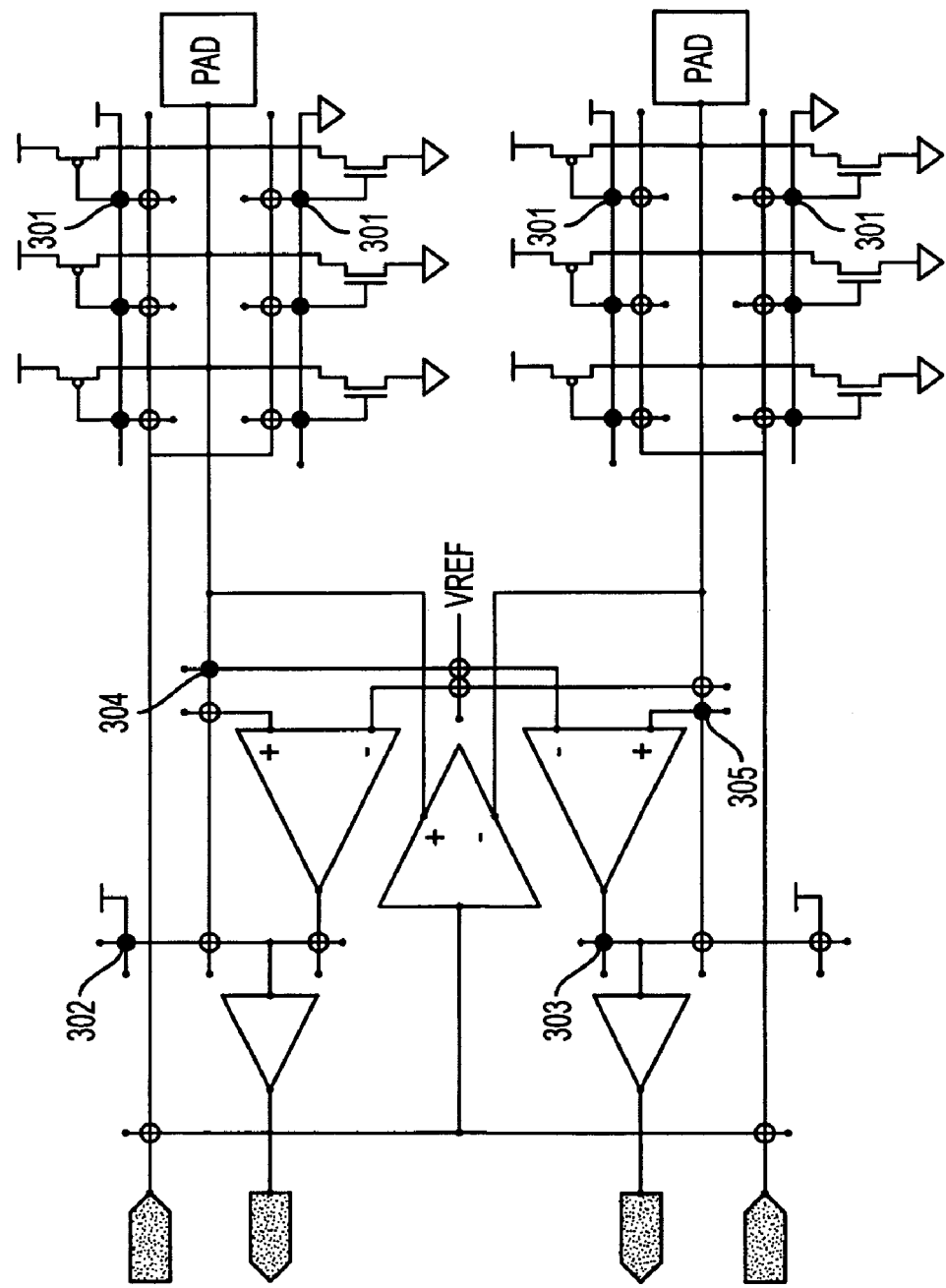
FIG. 30 is a drawing illustration of pair of customizable I/O customized as differential outputs
Figure 31:
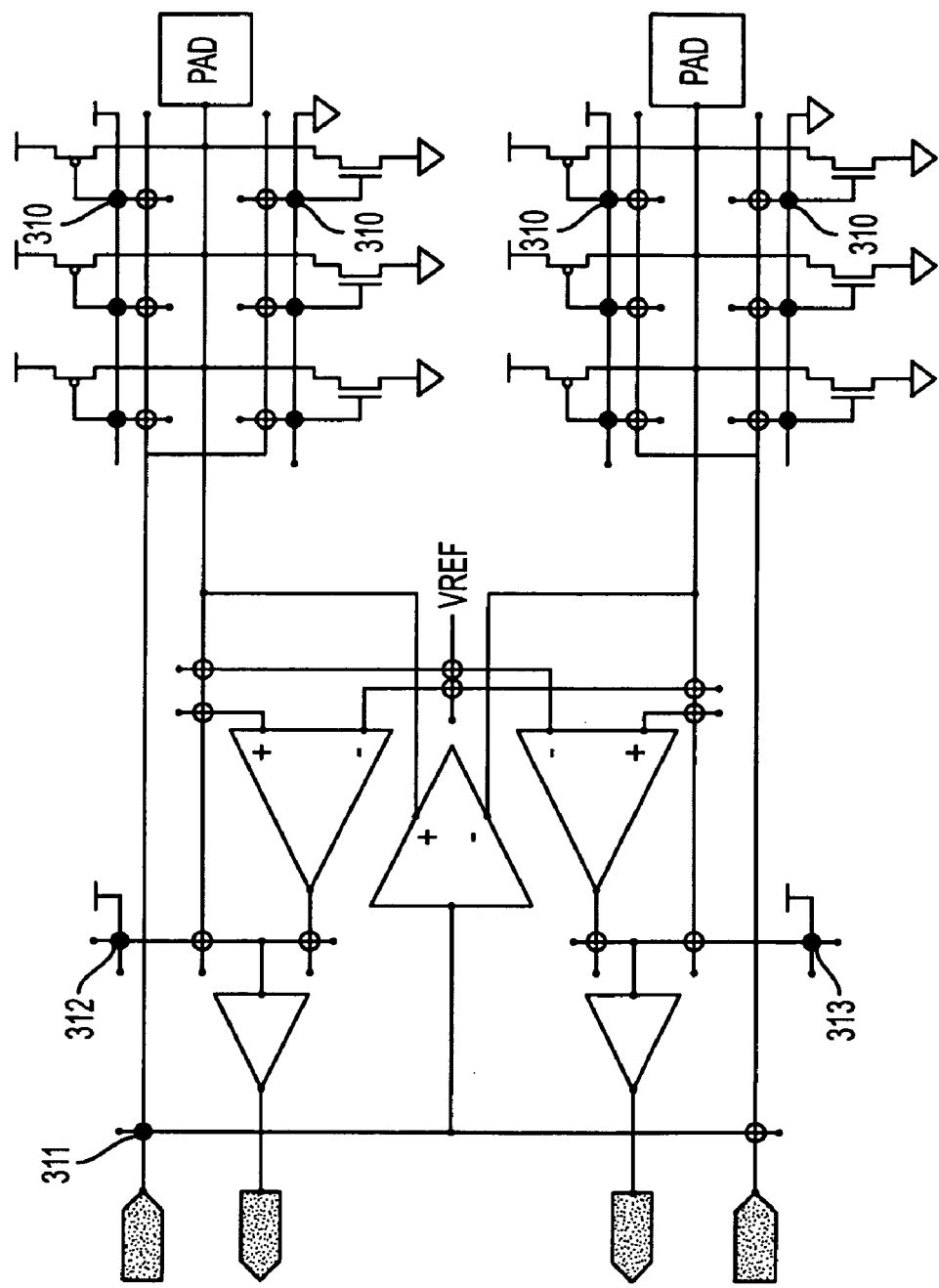
FIG. 31 is a drawing illustration of pair of customizable I/O customized as differential output.

FIGS. 27 to 31 show examples of configuration for enhanced via-configurable I/O. The black circle (FIG. 27 element 270) represents a connection realized with configurable via. FIG. 27 shows an enhanced via-configurable I/O implementing two single ended output I/O interfaces. The signal coming from the chip core or from a previous stage of the I/O circuit is connected to the output buffer 263 transistors using the configuration via 272. The input buffers 264 are tied off using another configuration via 271. FIG. 28 shows the implementation of two single ended input interfaces. The output buffers 263 are inactivated using via configurable connections 281. Using a via configurable connection 280 the pad 260 is connected directly to the input buffer 264. FIG. 29 shows the implementation of two voltage-referenced input interfaces. The output buffers 263 are inactivated using the connections 291. The two input differential amplifiers 262 have their inverting inputs connected to a reference voltage, which has to be supplied from outside using connections 292, and their non-inverting inputs are connected to the pads 260 using connections 293. The outputs of the input differential amplifiers 262 are connected to input buffers 264 using the connection 290. FIG. 30 shows the implementation of one differential input interface and uses connection 301 to inactivate the output buffers 263, connection 302 to tie off one input buffer 264, connections 304 and 305 to connect the pads 260 to the inverting respectively non-inverting inputs of one differential input amplifier 262 and connection 303 to connect the output of the differential input amplifier 262 to the input buffer 264. FIG. 31 shows the implementation of one differential output interface and uses connection 310 to inactivate the output buffers 263, connections 312 and 313 to tie off the input buffers 264 and 311 to connect the signal coming from the chip core or from a previous stage of the I/O circuit to the input of the differential output amplifier 261

Figures 1, 21:
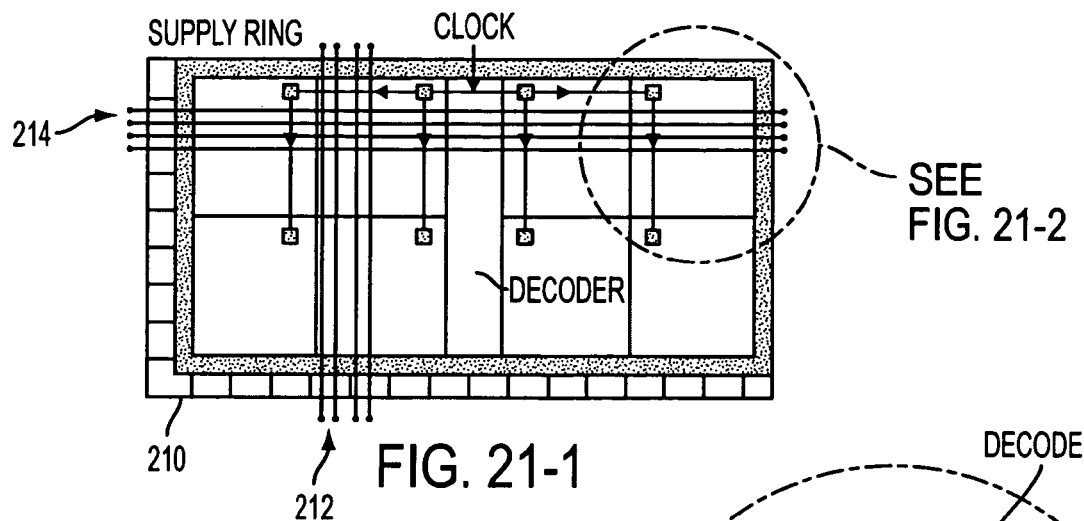
FIG. 21, consisting of FIGS. 21-1, 21-2, and 21-3 is a drawing illustration of very long tracks over a core.
Figures 2, 21:
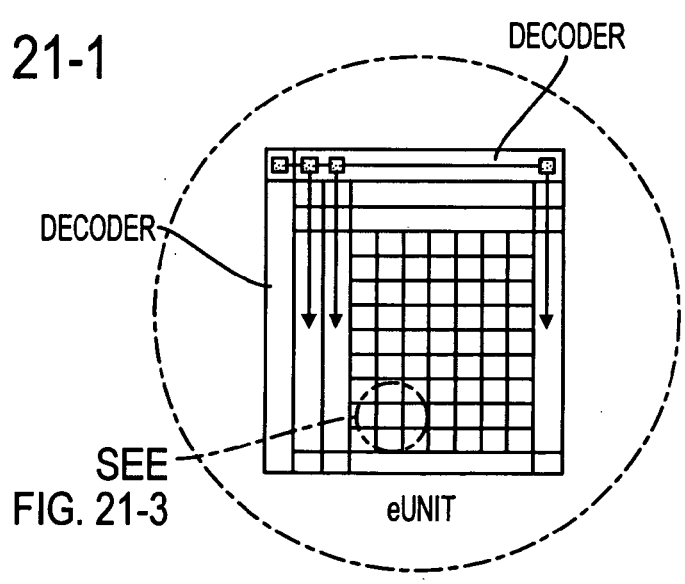
Figures 3, 21:
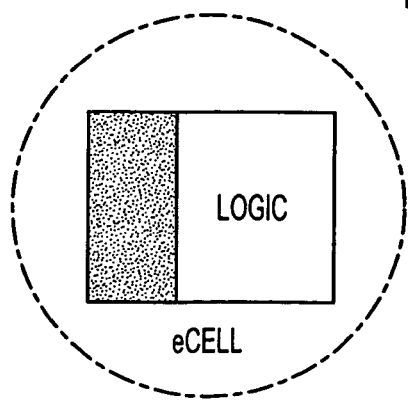

In another embodiment of this current invention additional routing channels, called very long tracks, are introduced. Reference is now made to FIG. 21. FIG. 21 is a drawing illustration of very long tracks 212, 214 across a module 210. The very long tracks could go under or over the local routing fabric 150 to allow segmented routing of more than 4 metal layers. When many modules are tiled together to construct array of logic with over million gates, more than 4 layers of routing might be required. The current invention suggests the use of very long tracks in addition to the short tracks and long tracks described in U.S. Pat. No. 6,331,733. The very long tracks would have very few, or even zero, contacts within the module. The router software could assign the very long tracks to route between logic cells that are very far apart. At every end point or contact point of the very long track, short routing tracks would be used to connect it to the 4-metal routing fabric. This approach allows extension of the segmented routing architecture to as many metal layers as the fabrication process supports. It is further contemplated that very long tracks will include jumpers 154, an example of which is shown in FIG. 15, between each repeating core, to allow for scribing between repeating cores while maintaining reliable use of all segments. In addition, it is contemplated that some of these long lines may be used for power and ground distribution across modules within target dies. The very long tracks might be placed on a dedicated metal layer, on metal layers that are used to construct the logic array or on the metal layers that are used for interconnect. The potential scribe line between repeating module might be in some cases a preferable location for the very long track.

Figure 22:
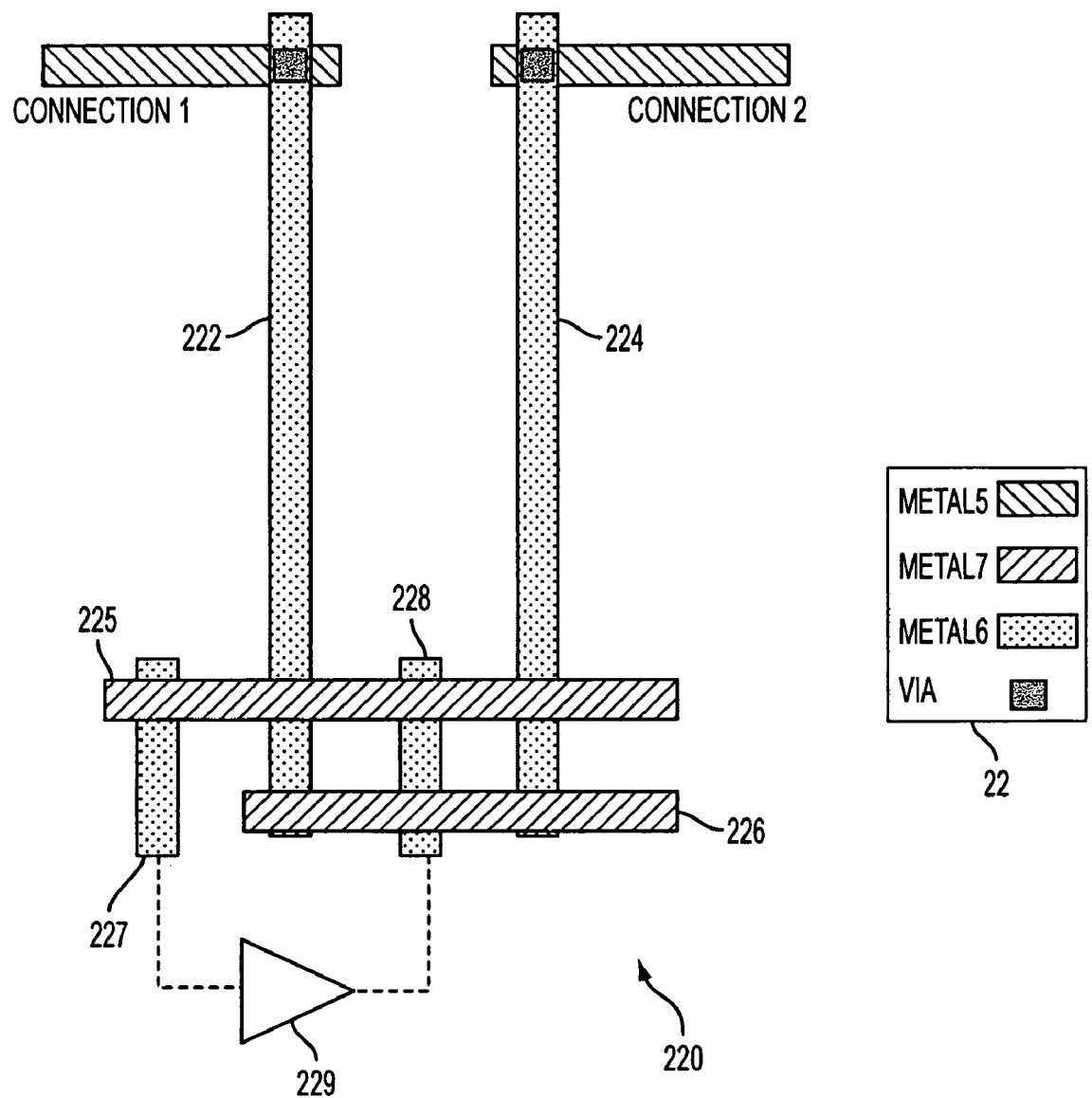
FIG. 22 is a drawing illustration of a configurable buffer structure.

In another embodiment of this current invention a 'scramble box' is proposed for the routing connection between modules 28 or 210. The objective of such 'scramble box' is to reduce cross talk between long lines that run adjacent to each other. By having such 'scramble box' be a part of the generic fabric the reduction of cross talk is provided in the fabric itself rather than by the careful design of the customization layers. Preferably such 'scramble box' would include buffers to farther simplify the customization and redrive signals of long lines. Reference is now made to FIG. 22. FIG. 22 is a drawing illustration of a configurable buffer structure. The 220 illustrates via configurable buffer structure. It includes a buffer 229 that is in the lower layers two Metal 7 jumpers 225, 226 and four Metal 6 connection lines. By selecting two or four vias the structure could be configured for:

(1) Buffer line 222 to line 224;
(2) Buffer line 224 to line 222;
(3) Connect line 222 with line 224 with no buffer and tie off the buffer;
(4) Leave lines 222 and 224 unconnected and tie off the buffer.

Figure 23:
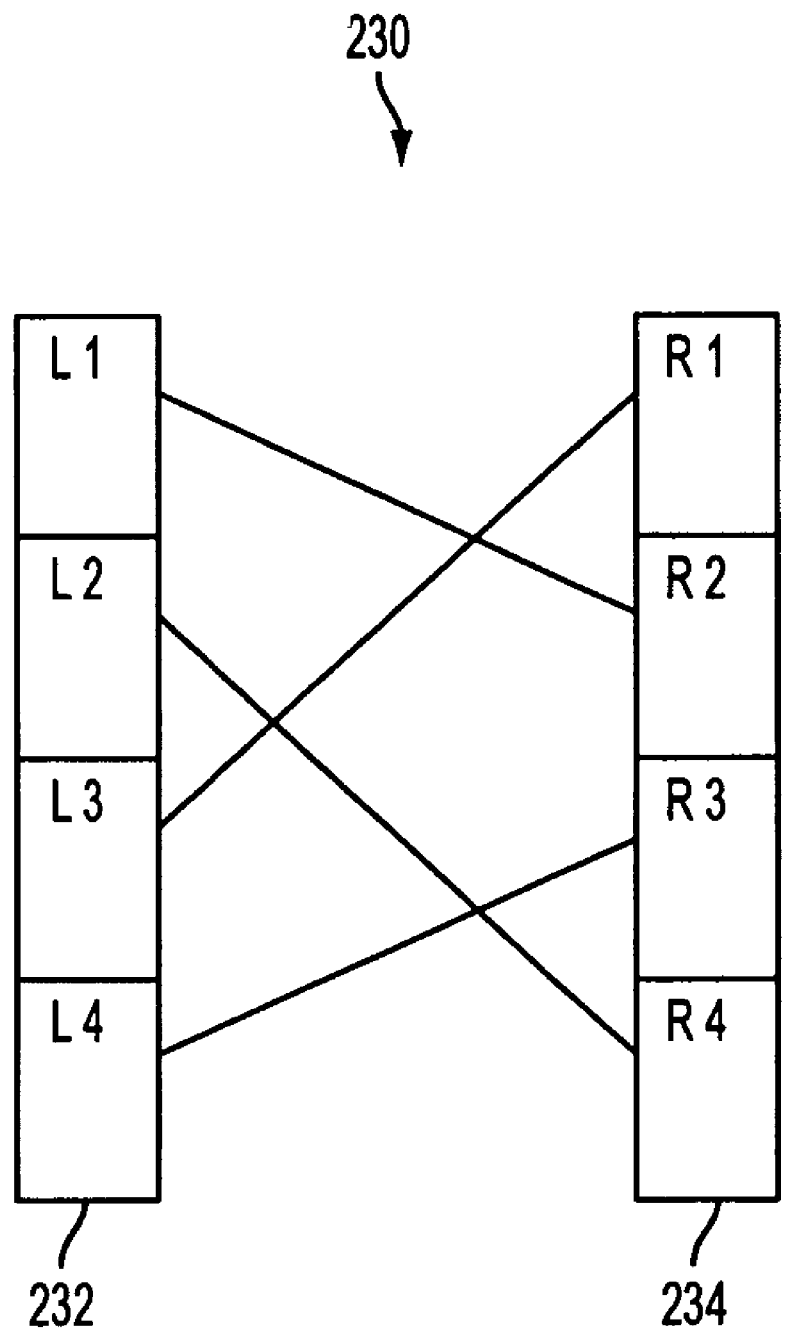
FIG. 23 is a drawing illustration of a simple "scramble box;"

FIG. 23 is a drawing illustration of a simple 'scramble box' function. Four lines are coming into the 'scramble box' 230 on one side 232 and coming out from the other side 234, where each line now has new "neighbors".

Figure 24:
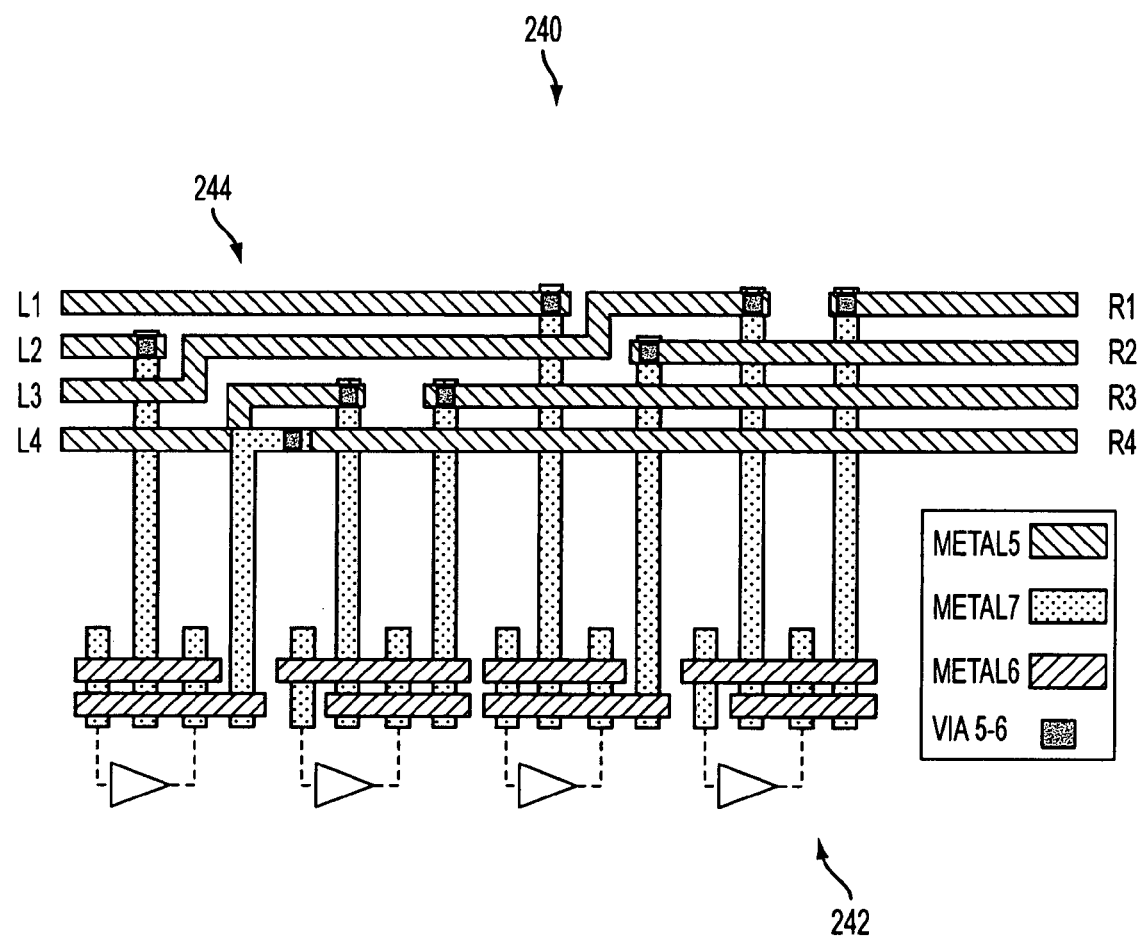
FIG. 24 is a drawing illustration of "scramble box" layout.

FIG. 24 is a drawing illustration of 'scramble box' layout. The four lines 'scramble box' 240 includes a configurable buffers structure 242.

Figure 25:
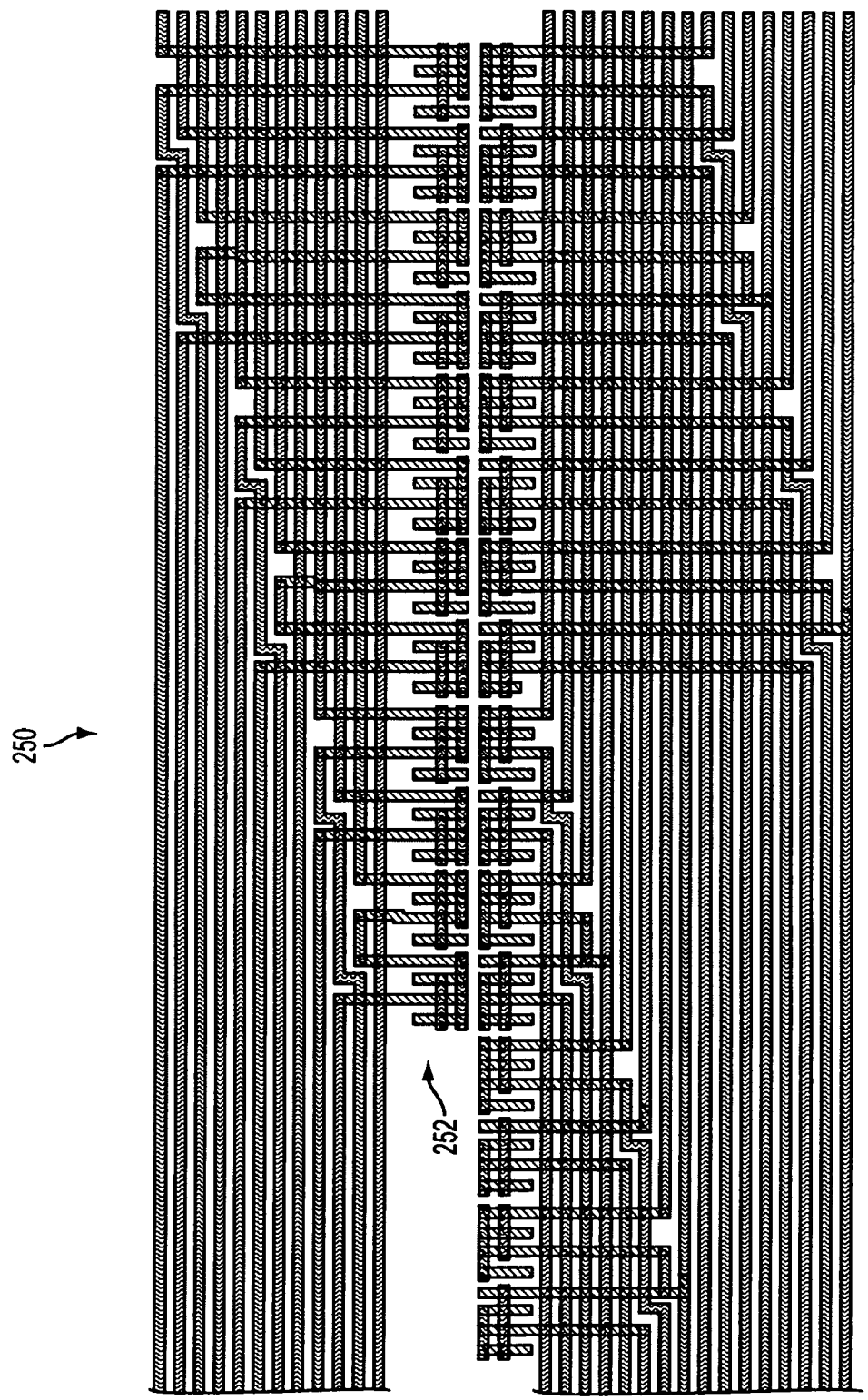
FIG. 25 is a drawing illustration of "scramble box" layout for 24 lines.

FIG. 25 is a drawing illustration of 'scramble box' layout for 28 lines 250. It comprises seven copies of the structure 240 and it includes 28 buffer structure 252.

Figures 1, 33:
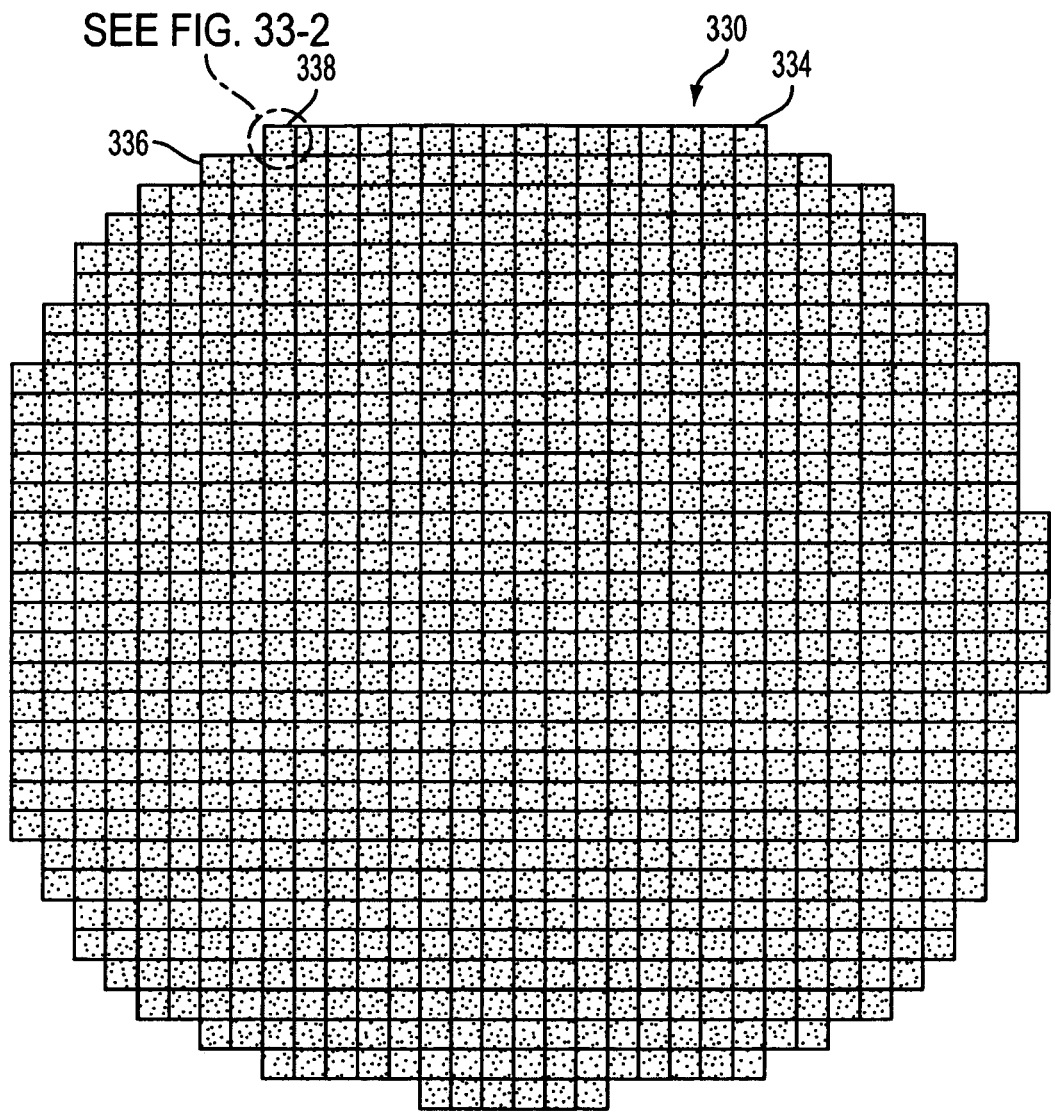
FIG. 33, consisting of FIGS. 33-1 and 33-2, is a drawing illustration of a wafer which comprise continuous array structure by tiling a module.
Figures 2, 33:
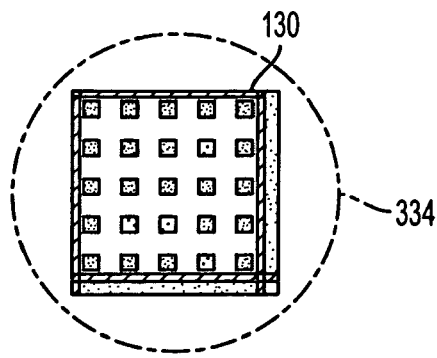

Yet another alternative of the current invention seeks to maintain standard production. In this alternative the dicing of the wafer is done in the conventional way of FIG. 1 and dicing streets do not comprise metal lines, so scribe lines are similar to those of most semiconductor devices. In this alternative the top metal is customized to the specific die size while all the other layers are constructed as described before in a continuous array fabric. As an example, a continuous array utilizing eASIC technology would be constructed with generic metal up to and including Metal-3. This continuous array would be constructed in a modular structure of tiling module such as module 130 of FIG. 13. Each such module comprises also designated area for scribe line 136. FIG. 33 is a drawing of a wafer 330 with continuous tiling of module 334 which would be constructed such as module 130. FIG. 33 also shows the potential scribe lines 336, 338.

Such generic base fabric would than used to construct logic array of a various die sizes by constructing the top metal layers accordingly. The top metal layers such as Metal-4 to Metal-8 could be constructed as generic pattern to be customized by one or more application specific custom mask. Alternatively all metal layers might be custom.

Figure 34:
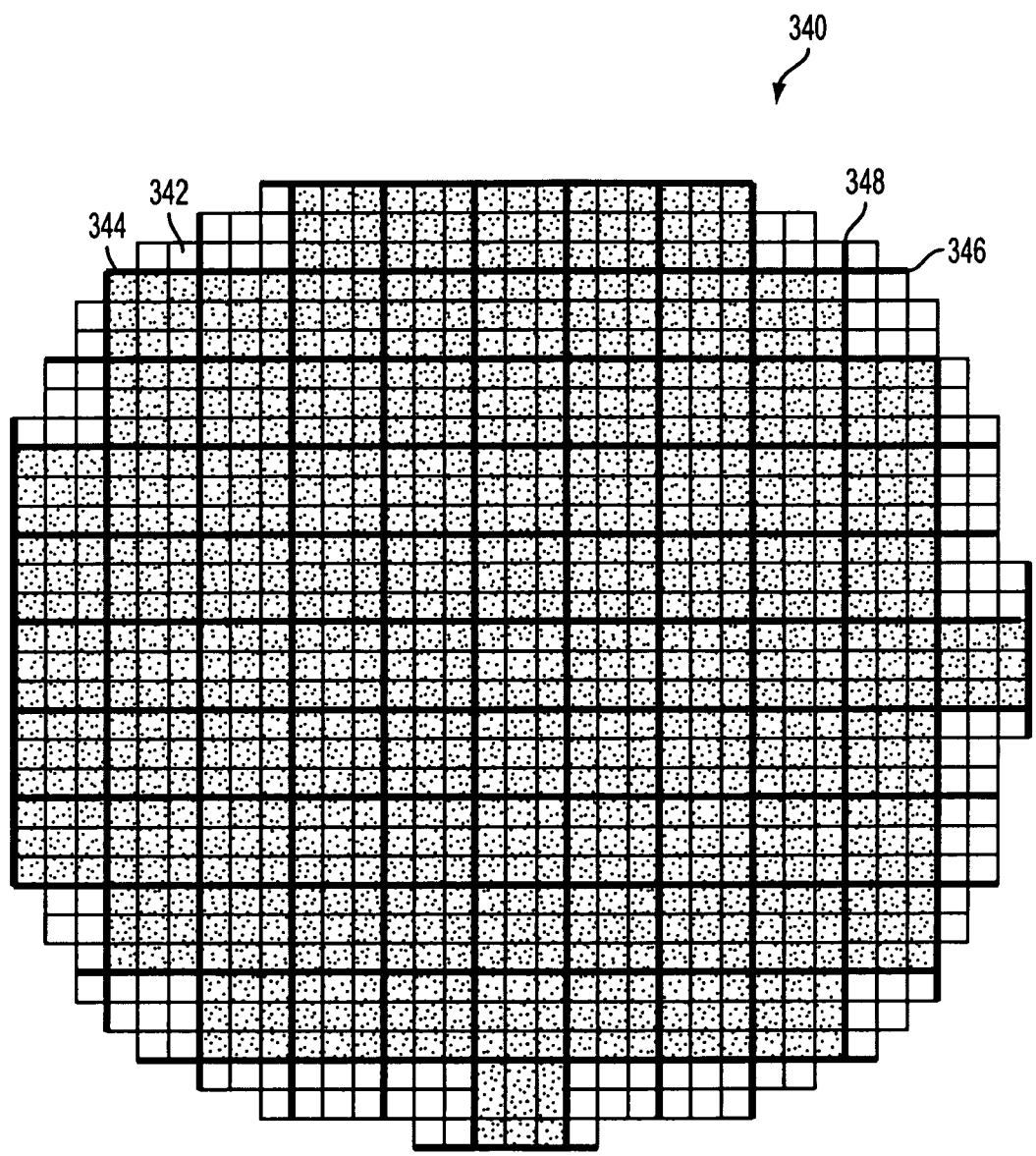
FIG. 34 is a drawing illustration of a wafer with top metal defining a die size of 3×3 modules.

FIG. 34 is a drawing of wafer 340 where the top metal arranged to construct die 344 of 3×3 module 130. The wafer scribe lines 346, 348 are subset of the potential scribe lines of FIG. 33.

Figure 35:
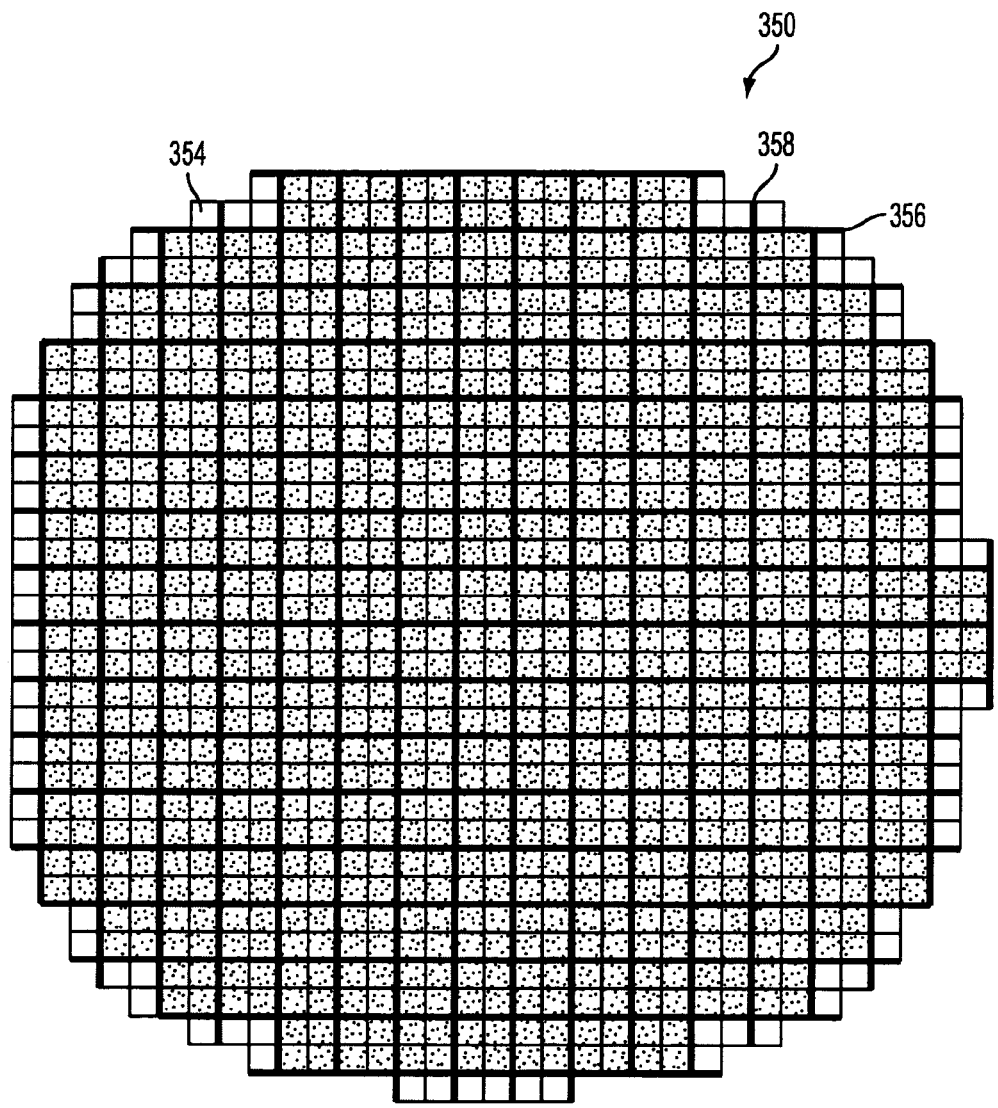
FIG. 35 is a drawing illustration of a wafer with top metal defining a die size of 2×2 modules.

FIG. 35 is a drawing of wafer 350 where the top metal is arranged to construct a different die size. Die 344 is 2×2 module 130. Wafer 350 scribe lines 356, 358 are another subset of the potential scribe lines of FIG. 33.

This alternative of the current invention could be used for high volume production of designs that have been prototyped with the method described earlier, whereby various die sizes are place on the same wafer—FIG. 7 and FIG. 8. It might be preferable to designate few die sizes for prototype and low volume purposes, and to constrain placement of specific design according to the target die size planned for the high volume production phase, and to use that placement for the layout of the volume part. This minimizes the risk that the volume parts will behave differently from the prototype parts.

Additional option of this alternative is to use the top metal layers to construct pads at the die edge and to connect those pads to the appropriate I/O within the die. Constructing pads on the die edge would enable wire bonding packaging for situations when wire bonding is preferable to flip-chip.

The repeating module could comprise regular logic fabric of eCells and I/O portion comprising via-configurable I/O. The ratio of the I/O portion to the logic is a design choice. The repeating module would be designed accordingly. There are advantages to align the I/O cells along one or two of the module edges as demonstrated in FIGS. 36 and 37.

FIG. 36 demonstrates a module 360 with I/O cells along the right side edge 362 with the designated room for scribe lines 364 along the bottom and the right sides. FIG. 36-B demonstrates a tiling portion 368 of 2×3 module 360.

FIG. 37 demonstrates a module 370 with I/O cells along the right side edge 372 and the bottom edge 373 with the designated room for scribe lines 374 along the bottom and the right sides. FIG. 37-B demonstrates a tiling portion 378 of 2×3 module 370.

The use of redistribution layers allows placing the I/O cell according to the desired logic to I/O ratio and other architectural technical consideration, while the number of pads and their placement could be done according to the specific need of each custom design. This is an important attribute of the current invention.

The size and the aspect ratio the repeating module would be set according to the requirements of any specific product offering. In general, it would be desired to keep the horizontal and the vertical sizes to be less than 1 mm. Logic devices are used with die sizes smaller even than 3×3 mm$^2$ and up to a whole reticle sizes of over 20×20 mm$^2$. For a small device an increment of one module, sized 1×1 mm square, might result in adding 1 mm to the die width as for many reasons die are made rectangular. That could mean that the die area will be increased by 33%. It therefore desired to keep the size of the repeating module, and of the resulting increase in the linear die dimension, relatively small.

A configurable I/O circuit such that has been described in FIG. 32 may require an area of 24,000 μ$^2$ for I/O pair at 0.13μ processes. The ratio of the area, dedicated for the I/O 362, to the total area of the repeating module 360 will drive the percent of the die area dedicated to I/Os. In most cases it is desirable to keep this ratio down, so most of the die real estate is devoted for circuit function, rather than to interfaces in and out of the device. For most cases it would be preferable to have that ratio below 20%.

Figure 38:
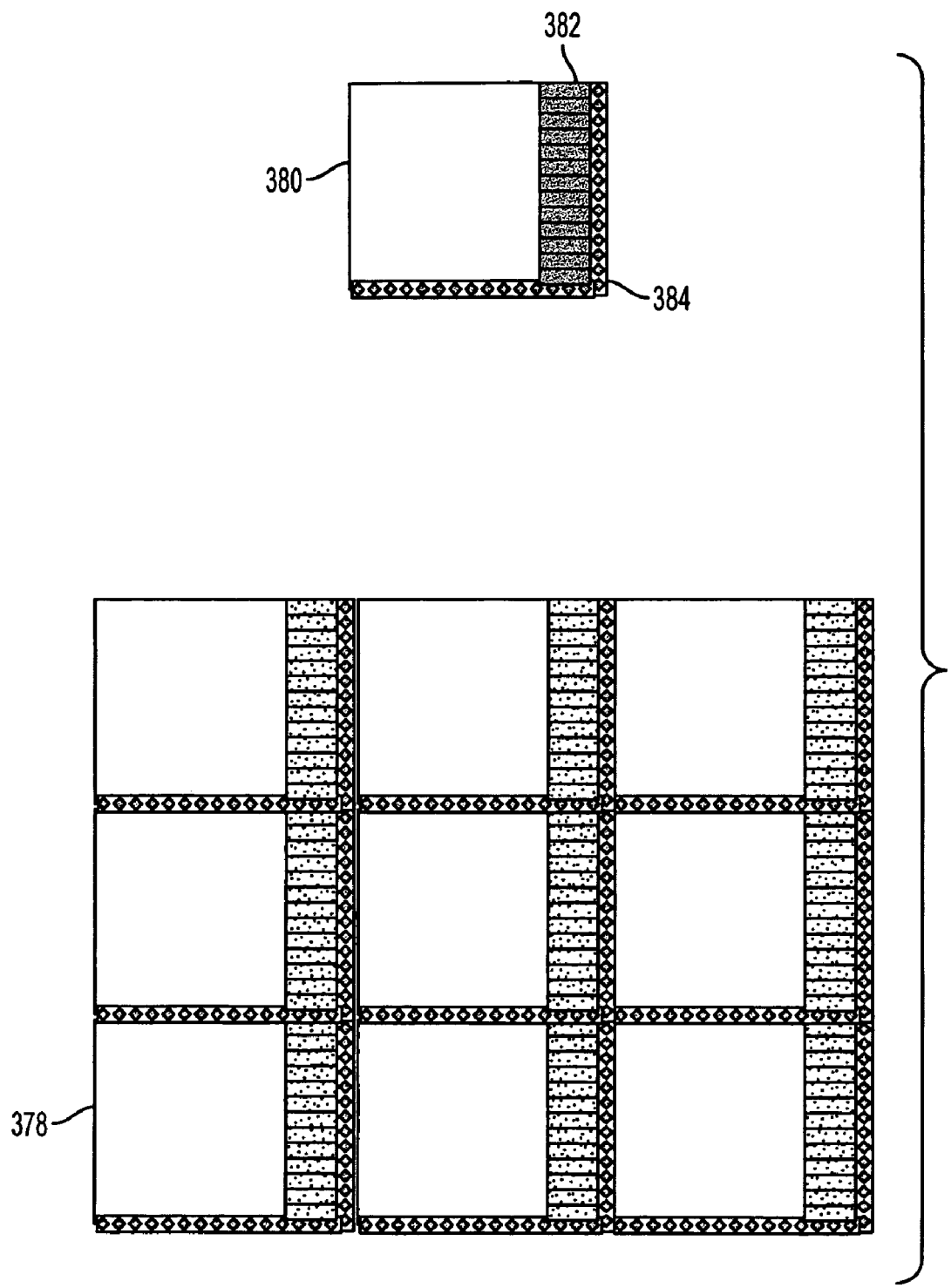
FIG. 38 is a drawing illustration of a repeating module.
Figure 39:
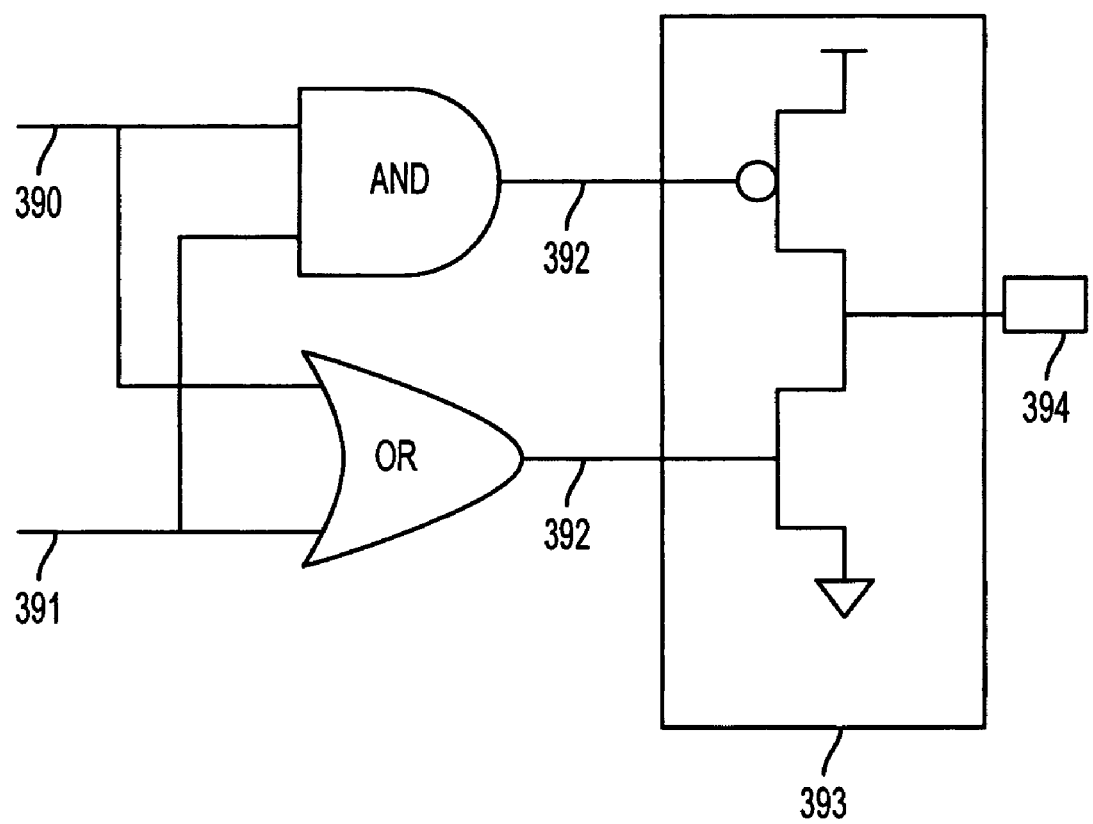
FIG. 39 is a drawing illustration of a predriver circuit.

For a repeating module 360 sized at about 0.5×0.5 mm²-equal to 250,000 µ²-the I/O portion 362 should be therefore less than 50,000 µ². Which implies that only two pairs would fit in. FIG. 38 illustrates a repeating module 380 with two pairs of I/O 382. In cases when it is desirable to keep one physical shape of the I/O it will be easier to have the two I/O pairs 382 side by side as illustrated in FIG. 38. FIG. 38 also illustrates 3×3 module section 378 of the repeating module fabric. Repeating module fabric could therefore be used to construct specific custom product with specific amount of logic and sized accordingly. The base layers of such fabric could be useful for many applications, each with its own amount of logic, and accordingly size. A specific application would use custom top layers to customize the generic fabric by having the top layers custom. The top custom layers would include a redistribution layer to support pad construction to allow proper packaging of the device. The redistribution could arrange the pads in surrounding structure as is illustrated in FIG. 3C so conventional bonding could be used, or in array structure for flip chip packaging. In a case where the repeating module uses eCells, the generic layers would be all layers up to M4, and M4 to M8 or M9 would be custom. Yet many alternative schemes could be used. M4 to M7 are typically used for signal routing while M8 and M9 would be used for Pads redistribution, power distribution and clocks distributions. It could be preferred to have the via layers other than Via 6 generic and in some cases it may effective to keep M6 and M7 generic too. If the dicing process allows cutting through metal lines, then M4 to M7 could be generic and only Via6 could be custom.

If customization by only Via6 is used for prototyping and low volume, and for high volume production a specific custom M4 to M8 are used to allow conventional dicing or for other consideration, then it will be preferable to use the preferable embodiment of this invention that was described in reference to FIG. 15.

It will be appreciated by persons skilled in the art that the present invention is not limited to what has been particularly shown and described hereinabove. Rather, the scope of the present invention includes both combinations and sub-combinations of various features described hereinabove as well as modifications and variations which would occur to persons skilled in the art upon reading the foregoing description and which are not in the prior art.

We claim:

1. A semiconductor device comprising:
   a borderless logic array comprising repeating cores; area I/Os, wherein at least one of said area I/Os is located in said semiconductor device such that some of said repeating cores are placed adjacent to two opposite sides of the area I/O;
   wherein at least one of said area I/Os is a configurable I/O, and wherein said configurable I/O comprises at least one metal layer that is the same for all I/O configurations.

2. A semiconductor device according to claim 1, wherein said configurable I/O comprises:
   at least two electronic components; and
   multiple possible connections among said electronic components, wherein at least one custom via layer is used to complete at least one of said possible connections to configure said configurable I/O.

3. A semiconductor device according to claim 1, wherein some of said area I/Os are arranged in spaced parallel lines.

4. A semiconductor wafer comprising:
   a borderless logic array, wherein said borderless logic array comprises a repeating module containing logic cells and I/O cells and a redistribution layer for redistributing at least some of said I/O cells' connections to pads used in packaging, wherein at least one of said I/O cells comprises an area I/O having logic cells adjacent to opposite sides of the area I/O.

5. A semiconductor device according to claim 4, wherein some of said area I/Os are arranged in spaced parallel lines.

6. A semiconductor wafer according to claim 5, wherein spaced parallel lines are spaced at least 0.2 mm apart but less than 3 mm apart.

7. A semiconductor wafer according to claim 4, wherein said repeating module comprises at least two metal layers.

8. A semiconductor wafer according to claim 7, wherein at least one of said metal layers comprises a repeating pattern.

9. A semiconductor wafer according to claim 7, wherein each of said metal layers comprises a repeating pattern.

10. A semiconductor wafer according to claim 7, wherein additional custom layers are arranged to define a specific die size on said semiconductor wafer.

11. A semiconductor wafer according to claim 7, wherein additional custom layers are arranged to define at least two different die sizes on said semiconductor wafer.

12. A semiconductor wafer according to claim 4, wherein at least one of said I/O cells comprises:
    at least two electronic components; and
    multiple possible connections among said electronic components, wherein at least one custom via layer is used to complete at least one of said possible connections to configure at least one of said I/O cells.

13. A semiconductor device comprising:
    a borderless logic array comprising repeating cores; area I/Os, wherein at least one of said area I/Os is located in said semiconductor device such that some of said repeating cores are placed adjacent to two opposite sides of the area I/O; and wherein said logic array comprises a repeating core and a redistribution layer for redistributing at least some of said area I/O connections to pads used in packaging.

14. A semiconductor device comprising:
    a borderless logic array; area I/Os, wherein at least one of said area I/Os is located in said semiconductor device such that there is logic adjacent to two opposite sides of the area I/O; and wherein at least one of said area I/Os is a configurable I/O, and a redistribution layer for redistributing at least some of said area I/O connections to pads used in packaging.

15. A logic array device comprising:
    a borderless logic array; area I/Os, wherein at least one of said area I/Os is located in said semiconductor device such that there is logic adjacent to two opposite sides of the area I/O; and wherein at least one of said area I/Os is a configurable I/O, and wherein said configurable I/O comprises at least one metal layer that is the same for all I/O configurations.

16. A logic array device according to claim 15, wherein said configurable I/O further comprises:
    at least two electronic components; and
    multiple possible connections among said electronic components, wherein a custom via layer is used to complete at least one of said possible connections to configure said configurable I/O.

17. A semiconductor device comprising:
    a continuous logic array comprising repeating cores; area I/Os, wherein at least one of said area I/Os is located in said semiconductor device such that some of said repeating cores are placed adjacent to two opposite sides of the area I/O;

wherein at least one of said area I/Os is a configurable I/O, and wherein said configurable I/O comprises at least two metal layers that are the same for all I/O configurations.

18. A semiconductor device comprising:

area I/Os, where at least one of said area I/Os is located in said semiconductor device such that logic is placed adjacent to two opposite sides of the area I/O;

wherein at least one of said area I/Os is a configurable I/O, and wherein said configurable I/O comprises at least two metal layers that are the same for all I/O configurations.

19. A semiconductor wafer comprising:

a continuous logic array, wherein said continuous logic array comprises a repeating module containing logic cells and I/O cells and a redistribution layer for redistributing at least some of said I/O cells' connections to pads used in packaging;

wherein at least one of said I/O cells comprises area I/O having logic cells adjacent to opposite sides of the area I/O.

20. A semiconductor wafer comprising:

a logic array, said logic array comprising a repeating module containing logic cells and I/O cells and a redistribution layer for redistributing at least some of said I/O cells' connections to pads used in packaging;

wherein at least one of said I/O cells comprises an area I/O having logic cells adjacent to opposite sides of the area I/O.

21. A semiconductor wafer according to claim 20, wherein said I/O cells are arranged in spaced parallel lines.

22. A semiconductor wafer according to claim 21, wherein said spaced parallel lines are spaced at least 0.2 mm apart but less than 3 mm apart.

23. A semiconductor device according to claim 20, wherein said repeating module comprises at least two metal layers, wherein at least one of said two metal layers comprises a repeating pattern.

* * * * *